United States Patent
Yokota et al.

(10) Patent No.: US 6,807,024 B1
(45) Date of Patent: Oct. 19, 2004

(54) REPRODUCING APPARATUS AND REPRODUCING METHOD

(75) Inventors: Teppei Yokota, Chiba (JP); Nobuyuki Kihara, Tokyo (JP); Eiichi Yamada, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/534,829

(22) Filed: Mar. 23, 2000

(30) Foreign Application Priority Data

| Mar. 26, 1999 | (JP) | ............................................ | 11-084920 |
| Jun. 25, 1999 | (JP) | ............................................ | 11-179588 |

(51) Int. Cl.$^7$ .................. G11B 15/04; G11B 19/04; G11B 5/09
(52) U.S. Cl. .................................... 360/60; 360/53
(58) Field of Search ........................... 360/46, 53, 51, 360/48, 60, 31

(56) References Cited

U.S. PATENT DOCUMENTS

| 4,965,680 A | * | 10/1990 | Endoh | .......................... 360/60 |
| 5,426,745 A | * | 6/1995 | Baji et al. | .................... 345/469 |
| 5,754,687 A | * | 5/1998 | Fujimori et al. | ............ 382/190 |
| 5,999,694 A | * | 12/1999 | Yasuda et al. | ................ 386/70 |
| 6,310,956 B1 | * | 10/2001 | Morito et al. | ............... 380/201 |
| 6,618,335 B2 | * | 9/2003 | Tanaka et al. | ........... 369/53.21 |

FOREIGN PATENT DOCUMENTS

EP     0 268 139     5/1988

* cited by examiner

*Primary Examiner*—David Hudspeth
*Assistant Examiner*—Glenda P Rodriguez
(74) *Attorney, Agent, or Firm*—Frommer Lawrence & Haug LLP; William S. Frommer

(57) ABSTRACT

A reproducing apparatus and method, the method comprising the steps of comprising recording a plurality of files and number-of-reproduction-times limitation information thereof, selecting a desired file from the plurality of files stored in the memory, and comparing whether the number-of-reproduction-times limitation information allows for reproduction of the selected file. The method further comprises the steps of counting the reproduced elapsed duration of the selected file and comparing whether the reproduced elapsed duration exceeds a predetermined value. The number-of-reproduction-times limitation information stored in the memory is edited when the reproduced elapsed duration exceeds the predetermined value to reduce the number of times the selected file may be subsequently be reproduced.

20 Claims, 30 Drawing Sheets

Fig. 11

REPRODUCTION MANAGEMENT FILE (PBLIST)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0X0000 | BLKID-TLO | | | | Reserved | | MCode | | REVISION | | | | Reserved | | | |
| 0X0010 | SN1C+L | | SN2C+L | | SINFSIZE | | T-TRK | | VerNo | | Reserved | | | | | |
| 0X0020 | NM1-S(256) | | | | | | | | | | | | | | | |
| 0X0120 | NM2-S(512) | | | | | | | | | | | | | | | |
| 0X0320 | | | | Reserved | | | | | CONTENTSKEY | | | | | | | |
| 0X0330 | | | | Reserved | | | | | MAC | | | | | | | |
| | | | | | | Reserved | | | | | | | S-YMDhms | | | |
| 0X0350 | TRK-001 | | TRK-002 | | TRK-003 | | TRK-004 | | TRK-005 | | TRK-006 | | TRK-007 | | TRK-008 | |
| | TRK-009 | | TRK-010 | | TRK-011 | | TRK-012 | | TRK-013 | | TRK-014 | | TRK-015 | | TRK-016 | |
| 0X0660 | TRK-393 | | TRK-394 | | TRK-395 | | TRK-396 | | TRK-397 | | TRK-398 | | TRK-399 | | TRK-400 | |
| 0X0647 | INF-S(14720) | | | | | | | | | | | | | | | |
| 0X3FF0 | BLKID-TLO | | | | Reserved | | MCode | | REVISION | | | | Reserved | | | |

TRKTBL: 0X0350 – 0X0660

Fig. 12A

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0X0000 | BLKID-T1O | | | | Reserved | | MCode | | REVISION | | | | Reserved | | | |
| 0X0010 | SN1C+L | | SN2C+L | | SINFSIZE | | T-TRK | | VerNo | | | | | | Reserved | |
| 0X0020 | NM1-S(256) | | | | | | | | | | | | | | | |
| 0X0120 | NM2-S(512) | | | | | | | | | | | | | | | |
| 0X0320 | Reserved | | | | | | | | | | CONTENTSKEY | | | | | |
| 0X0330 | Reserved | | | | | | | | | | MAC | | | | | |
| | Reserved | | | | | | | | | | | | | S-YMDhms | | |
| 0X0350 | TRK-001 | | TRK-002 | | TRK-003 | | TRK-004 | | TRK-005 | | TRK-006 | | TRK-007 | | TRK-008 | |
| 0X0360 | TRK-009 | | TRK-010 | | TRK-011 | | TRK-012 | | TRK-013 | | TRK-014 | | TRK-015 | | TRK-016 | |
| 0X0660 | TRK-393 | | TRK-394 | | TRK-395 | | TRK-396 | | TRK-397 | | TRK-398 | | TRK-399 | | TRK-400 | |
| 0X0670 | INF-S(14720) | | | | | | | | | | | | | | | |
| 0X3FF0 | BLKID-T1O | | | | Reserved | | MCode | | REVISION | | | | Reserved | | | |

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| | INF | 0x00 | ID | 0x00 | SIZE | | MCode | | C+L | | Reserved | | DATA VARIABLE LENGTH | | | |

Fig. 13

| ID | MUSIC INFORMATION (CHARACTERS) | | ID | URL INFORMATION (WEB INFORMATION) | |
|---|---|---|---|---|---|
| 0 | RESERVED | | 32 | RESERVED | |
| 1 | ALBUM | VARIABLE | 33 | ALBUM | VARIABLE |
| 2 | SUBTITLE | VARIABLE | 34 | SUB TITLE | VARIABLE |
| 3 | ARTIST | VARIABLE | 35 | ARTIST | VARIABLE |
| 4 | CONDUCTOR | VARIABLE | 36 | CONDUCTOR | VARIABLE |
| 5 | ORCHESTRA | VARIABLE | 37 | ORCHESTRA | VARIABLE |
| 6 | PRODUCER | VARIABLE | 38 | PRODUCER | VARIABLE |
| 7 | PUBLISHER | VARIABLE | 39 | PUBLISHER | VARIABLE |
| 8 | COMPOSER | VARIABLE | 40 | COMPOSER | VARIABLE |
| 9 | SONG WRITER | VARIABLE | 41 | SONG WRITER | VARIABLE |
| 10 | ARRANGER | VARIABLE | 42 | ARRANGER | VARIABLE |
| 11 | SPONSOR | VARIABLE | 43 | SPONSOR | VARIABLE |
| 12 | CM | VARIABLE | 44 | CM | VARIABLE |
| 13 | GUIDE | VARIABLE | 45 | GUIDE | VARIABLE |
| 14 | ORIGINAL MUSIC PROGRAM TITLE | VARIABLE | 46 | ORIGINAL MUSIC PROGRAM TITLE | VARIABLE |
| 15 | ORIGINAL ALBUM TITLE | VARIABLE | 47 | ORIGINAL ALBUM TITLE | VARIABLE |
| 16 | ORIGINAL MUSIC PROGRAM COMPOSER | VARIABLE | 48 | ORIGINAL MUSIC PROGRAM COMPOSER | VARIABLE |
| 17 | ORIGINAL MUSIC PROGRAM SONG WRITER | VARIABLE | 49 | ORIGINAL MUSIC PROGRAM SONG WRITER | VARIABLE |
| 18 | ORIGINAL MUSIC PROGRAM ARRANGER | VARIABLE | 50 | ORIGINAL MUSIC PROGRAM ARRANGER | VARIABLE |
| 19 | ORIGINAL MUSIC PROGRAM PERFORMER | VARIABLE | 51 | ORIGINAL MUSIC PROGRAM PERFORMER | VARIABLE |
| 20 | MESSAGE | VARIABLE | 52 | | |
| 21 | COMMENT | VARIABLE | 53 | | |
| 22 | WARNING | VARIABLE | 54 | | |
| 23 | GENRE | VARIABLE | 55 | | |
| 24 | | | 56 | | |
| 25 | | | 57 | | |
| 26 | | | 58 | | |
| 27 | | | 59 | | |
| 28 | | | 60 | | |
| 29 | | | 61 | | |
| 30 | | | 62 | | |
| 31 | | | 63 | | |

Fig. 14

| ID | PATH/OTHERS | | ID | CONTROL/NUMERIC DATA INFORMATION | |
|---|---|---|---|---|---|
| 64 | RESERVED | | 96 | RESERVED | |
| 65 | PATH TO VIDEO DATA | VARIABLE | 97 | ISRC | 8 |
| 66 | PATH TO SONG DATA | VARIABLE | 98 | TOC_ID | 8 |
| 67 | PATH TO MIDI DATA | VARIABLE | 99 | UPC/JAN | 7 |
| 68 | PATH TO GUIDE DATA | VARIABLE | 100 | RECORDED DATE (YMDhms) | 4 |
| 69 | PATH TO COMMENT DATA | VARIABLE | 101 | RELEASED DATE | 4 |
| 70 | PATH TO CM DATA | VARIABLE | 102 | ORIGINAL MUSIC PROGRAM RELEASED DATE (YMDhms) | 4 |
| 71 | PATH TO FAX DATA | VARIABLE | 103 | RECORDED DATE (YMDhms) | 4 |
| 72 | PATH TO COMMUNICATION DATA 1 | VARIABLE | 104 | SUB TRACK | 4 |
| 73 | PATH TO COMMUNICATION DATA 2 | VARIABLE | 105 | AVERAGE VOLUME LEVEL | 1 |
| 74 | PATH TO CONTROL DATA | VARIABLE | 106 | RESUME | 4 |
| 75 | | | 107 | REPRODUCTION LOG (YMDhms) | 4 |
| 76 | | | 108 | NUMBER OF REPRODUCTION TIMES (FOR LEARNING) | 1 |
| 77 | | | 109 | PASSWORD 1 | 16 |
| 78 | | | 110 | APPLevel | 16 |
| 79 | | | 111 | GENRE CODE | 1 |
| 80 | | | 112 | MIDI DATA | |
| 81 | | | 113 | THUMB NAIL PHOTOGRAPH DATA | |
| 82 | | | 114 | TEXT MULTIPLEXED BROADCAST DATA | |
| 83 | | | 115 | NUMBER OF TOTAL MUSIC PROGRAMS | |
| 84 | | | 116 | SET NUMBER | |
| 85 | | | 117 | NUMBER OF TOTAL SETS | |
| 86 | | | 118 | REC POSITION INFORMATION - GPS | VARIABLE |
| 87 | | | 119 | PB POSITION INFORMATION - GPS | VARIABLE |
| 88 | | | 120 | REC POSITION INFORMATION - PHS | VARIABLE |
| 89 | | | 121 | PB POSITION INFORMATION - PHS | VARIABLE |
| 90 | | | 122 | CONNECTION DESTINATION TELEPHONE NUMBER 1 | VARIABLE |
| 91 | | | 123 | CONNECTION DESTINATION TELEPHONE NUMBER 2 | VARIABLE |
| 92 | | | 124 | INPUT VALUE | VARIABLE |
| 93 | | | 125 | OUTPUT VALUE | VARIABLE |
| 94 | | | 126 | PB CONTROL DATA | VARIABLE |
| 95 | | | 127 | REC CONTROL DATA | VARIABLE |

Fig. 15

| ID | SYNCHRONOUS REPRODUCTION INFORMATION | |
|---|---|---|
| 128 | RESERVED | |
| 129 | SYNCHRONOUS REPRODUCTION INFORMATION 1 | VARIABLE |
| 130 | SYNCHRONOUS REPRODUCTION INFORMATION 2 | VARIABLE |
| 131 | SYNCHRONOUS REPRODUCTION INFORMATION 3 | VARIABLE |
| 132 | SYNCHRONOUS REPRODUCTION INFORMATION 4 | VARIABLE |
| 133 | SYNCHRONOUS REPRODUCTION INFORMATION 5 | VARIABLE |
| 134 | SYNCHRONOUS REPRODUCTION INFORMATION 6 | VARIABLE |
| 135 | | |
| 136 | | |
| 137 | | |
| 138 | EMD INFORMATION 1 | VARIABLE |
| 139 | EMD INFORMATION 2 | VARIABLE |
| 140 | | |
| 141 | | |
| 142 | | |
| 143 | | |
| 144 | | |
| 145 | | |
| 146 | | |
| 147 | | |
| 148 | | |
| 149 | | |
| 150 | | |
| 151 | | |
| 152 | | |
| 153 | | |
| 154 | | |
| 155 | | |
| 156 | | |
| 157 | | |
| 158 | | |
| 159 | | |

Fig. 17

A3Dnnnnn.MSA(ATRAC3 DATA FILE)

|  | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0x0000 | BLKID-HD0 | | | | Reserved | | MCode | | Reseved | | | | BLOCK SERIAL | | | |
| 0x0010 | N1C+L | | N2C+L | | INFSIZE | | T-PRT | | T-SU | | | | INX | | XT | |
| 0x0020 | NM1(256) | | | | | | | | | | | | | | | |
| 0x0120 | NM2(512) | | | | | | | | | | | | | | | |
| 0x0310 | | | | | | | | | | | | | | | | |
| 0x0320 | | Reserved(8) | | | | | | | CONTENTSKEY | | | | | | | |
| | | Reserved(8) | | | | | | | MAC | | | | | | | |
| | Reserved(12) | | | | | | | | | | | A | | LT | | FNo |
| | MG(D)SERIAL-nnn | | | | | | | | | | | | | | | |
| 0x0360 | CONNUM | | | | YMDhms-S | | | | YMDhms-E | | | | MT | CT | CC | CN |
| 0x0370 | PRTSIZE | | | | PRTKEY | | | | | | | | Reserved(8) | | | |
| 0x0380 | | | | | CONNUM0 | | | | PRTSIZE(0x0388) | | | | PRTKEY | | | |
| 0x0390 | | | | | Reserved(8) | | | | | | | | CONNUM0 | | | |
| | INF(0x0400) | | | | | | | | | | | | | | | |
| 0x3FFF | BLKID-HD0 | | | | Reserved | | MCode | | Reseved | | | | BLOCK SERIAL | | | |
| 0x4000 | BLKID-A3D | | | | Reserved | | MCode | | CONNUM0 | | | | BLOCK SERIAL | | | |
| 0x4010 | BLOCK SEED | | | | | | | | INITILIZATION VECTOR | | | | | | | |
| 0x4020 | SU-000(Nbyte=384byte) | | | | | | | | | | | | | | | |
| 0x41A0 | SU-001(Nbyte) | | | | | | | | | | | | | | | |
| 0x4320 | SU-002(Nbyte) | | | | | | | | | | | | | | | |
| 0x04A0 | SU-041(Nbyte) | | | | | | | | | | | | | | | |
| 0x7DA0 | | | | | | | | | | | | | | | | |
| 0x7F20 | Reserved(Nbyte=208byte) | | | | | | | | | | | | | | | |
| | BLOCK SEED | | | | | | | | | | | | | | | |
| 0x7FF0 | BLKID-A3D | | | | Reserved | | MCode | | CONNUM0 | | | | BLOCK SERIAL | | | |

Fig. 18

|  | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0x0000 | BLKID-HD0 | | | | Reserved | | MCode | | Reseved | | | | BLOCK SERIAL | | | |
| 0x0010 | N1C+L | | N2C+L | | INFSIZE | | T-PRT | | T-SU | | | | INX | | XT | |
| 0x0020 | NM1(256) | | | | | | | | | | | | | | | |
| 0x0120 | NM2(512) | | | | | | | | | | | | | | | |
| 0x0310 | | | | | | | | | | | | | | | | |

Fig. 19

| | | | | | | |
|---|---|---|---|---|---|---|
| 0x0320 | Reserved(8) | | CONTENTSKEY | | | |
| | Reserved(8) | | MAC | | | |
| | Reserved(12) | | | A | LT | FNo |
| | MG(D)SERIAL-nnn | | | | | |
| 0x0360 | CONNUM | YMDhms-S | YMDhms-E | MT | CT | CC | CN |

Fig. 20 bit7:MODE OF ATRAC3　　0:Dual　　1:Joint bit6,5,4　N OF 3 BITS:MODE VALUE

| N | MODE | TIME | TRANSMISSION RATE | SU | BYTES |
|---|---|---|---|---|---|
| 7 | HQ | 47min | 176kbps | 31SU | 512 |
| 6 | | 58min | 146kbps | 38SU | 424 |
| 5 | EX | 64min | 132kbps | 42SU | 384 |
| 4 | SP | 81min | 105kbps | 53SU | 304 |
| 3 | | 90min | 94kbps | 59SU | 272 |
| 2 | LP | 128min | 66kbps | 84SU | 192 |
| 1 | mono | 181min | 47kbps | 119SU | 136 |
| 0 | mono | 258min | 33kbps | 169SU | 96 | bit3:Reserved bit2:DATA TYPE　　0:AUDIO　　1:OTHER bit1:REPRODUCTION SKIP　0:NORMAL REP　1:SKIP bit0:EMPHASIS　　0:OFF　　1:ON(50/15 $\mu$ S)

Fig. 21

```
bit7      :COPY PERMISSION    0:COPY PROHIBITION    1:COPY PERMISSION
bit6      :GENERATION    0:ORIGINAL    1:FIRST OR LATER COPY GENERATION
HCMS bit5-4 :COPY CONTROL FOR HIGH SPEED DIGITAL COPY
          00:COPY PROHIBITION  01:COPY FIRST GENERATION 10:COPY PERMISSION
          COPY OPERATION OF CHILD OF FIRST COPY GENERATION IS PROHIBITED.
bit3-2   MagicGate AUTHENTICATION LEVEL
          00:Level10(Non-MG)    01:Level1
          10:Level2             11:Reserved
          DIVIDE AND COMBINE ARE PROHIBITED IN OTHER THAN LEVEL 10.
bit1,0    Reserved
```

Fig. 22

| | | | |
|---|---|---|---|
| 0x0370 | PRTSIZE | PRTKEY | Reserved(8) |
| 0x0380 | CONNUM0 | PRTSIZE(0x0388) | PRTKEY |
| 0x0390 | Reserved(8) | | CONNUM0 |

Fig. 23

| | | | | | |
|---|---|---|---|---|---|
| 0x4000 | BLKID-A3D | Reserved | MCode | CONNUM0 | BLOCK SERIAL |
| 0x4010 | BLOCK SEED | | | INITILIZATION VECTOR | |
| 0x4020 | SU-000(Nbyte=384byte) | | | | |

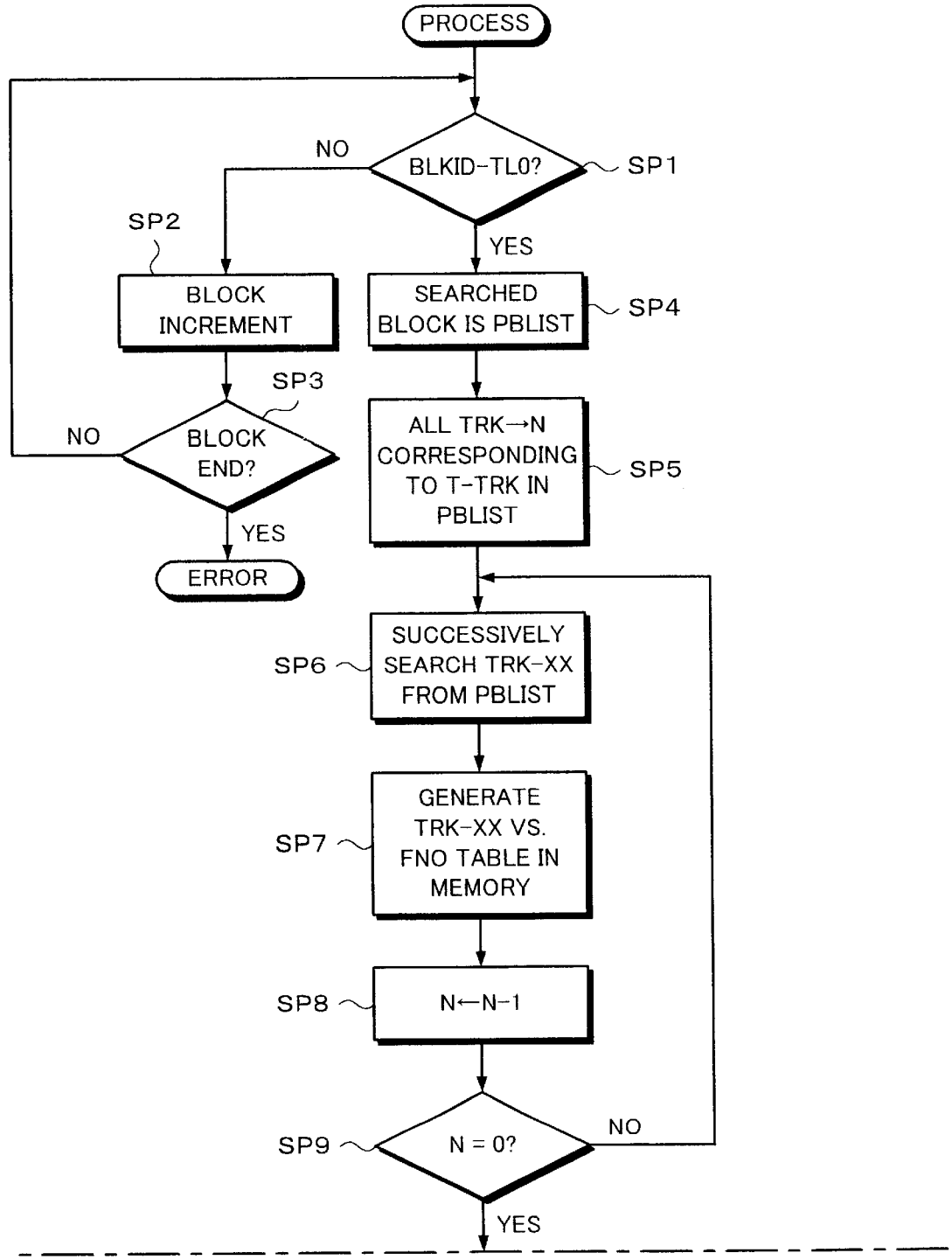

Fig. 27

TRACK INFORMATION MANAGEMENT FILE
(TRKLIST.MSF)

| offset | 0 1 2 3 | 4 5 | 6 7 | 8 9 A B | C D E F |
|---|---|---|---|---|---|
| 0x0000 | BLK ID-TL0 | T-TRK | MCode | REVISION | YMD h ms |
| 0x0010 | N1 N2 MSID | S-TRK | PASS | APP INF-S | S_YMD h ms |
| 0x0020 | | | | | |

|  |
|---|
| TRKINF-001 |
| PRTINF-001 |
| TRKINF-002 |
| PRTINF-002 |
| ⌇ |

| offset | | | | | |
|---|---|---|---|---|---|
| 0x3FF0 | BLK ID-TL0 | | MCode | REVISION | |
| 0x4000 | BLK ID-TL1 | | MCode | REVISION | |

⌇

DETAIL OF TRKINF-nnn/PRTINF-nnn

| 0 1 | 2 3 | 4 5 | 6 7 | 8 9 | A B C D E F |
|---|---|---|---|---|---|
| TO LT | INF-nnn | FNM-nnn | | CONTENTS KEY-nnn | |
| MG(D) SERIAL-nnn | | | | | |
| APP_CTL | CONNUM-nnn | P-nnn | XT | INX-nnn | |
| YMDhms-S | YMDhms-E | MT CT | CC CN | Reserved | |
| PR | A-0000 | PRTSIZE-0000 | | PRTKEY-0000 | |
| ⌇ | | | | | |
| PR | A-nnnn | PRTSIZE-nnnn | | PRTKEY-nnnn | |

| 0x7FF0 | BLK ID-TL1 | | MCode | REVISION | |
|---|---|---|---|---|---|

Fig. 28

STICK NAME AND PROGRAM NAME BLOCK-FOR ONE BYTE CODE

|   | 0 | 1 | 2 | 3 | 4 | 5 | 6 | 7 |
|---|---|---|---|---|---|---|---|---|
| 0x8000 | BLK ID-NM1 | | | | | | MCode | |
| 0x8008 | PNM1-S | | | | PNM1-001 | | | |
| 0x8010 | PNM1-002 | | | | PNM1-003 | | | |
| | ⌇ | | | | | | | |
| 0x8668 | PNM1-408 | | | | NM1-S | | | |
| | NM1-001 NM1-002 NM1-003 ⌇ NM1-408 | | | | | | | |
| 0xBFF0 | | | | | | | | |
| 0xBFF8 | BLK ID-NM1 | | | | | | MCode | |

Fig. 29

STICK NAME AND PROGRAM NAME BLOCK-FOR TWO-BYTE CODE

|   | 0 | 1 | 2 | 3 | 4 | 5 | 6 | 7 |
|---|---|---|---|---|---|---|---|---|
| 0xC000 | BLK ID-NM2 | | | | | | MCode | |
| 0xC008 | PNM2-S | | | | PNM2-001 | | | |
| 0xC010 | PNM2-002 | | | | PNM2-003 | | | |
| | ⌇ | | | | | | | |
| 0xC668 | PNM2-408 | | | | NM2-S | | | |
| | NM2-001 NM2-002 NM2-003 ⌇ NM2-408 | | | | | | | |
| 0xFFF0 | | | | | | | | |
| 0xFFF8 | BLK ID-NM2 | | | | | | MCode | |

Fig. 30

ATRAC3 DATA FILE (A3Dnnnnn.MSA) ··· 1 SoundUnit=N BYTES

| offset | 0 | 1 | 2 | 3 | 4 | 5 | 6 | 7 |
|---|---|---|---|---|---|---|---|---|
| 0x0000 | \multicolumn{4}{BLK ID-A3D} | | | MCode | |
| 0x0008 | \multicolumn{8}{BLOCK SEED} | | | | | | | |
| 0x0010 | CONNUM0 | | | | BLOCK SERIAL | | | |
| 0x0018 | INITIALIZATION VECTOR | | | | | | | |
| 0x0020 | SU-000 (N byte) | | | | | | | |
| 0x0020 +N/8 | SU-001 (N byte) | | | | | | | |
|  | SU-002 (N byte) | | | | | | | |
|  | ⸮ | | | | | | | |
|  | SU-(nnn-1) (N byte) | | | | | | | |
| 0x3FF0 -N/8 | Reserved (M byte) | | | | | | | |
| 0x3FF0 | BLOCK SEED | | | | | | | |
| 0x3FF8 | BLK ID-A3D | | | | | | MCode | |

ADDITIONAL INFORMATION MANAGEMENT FILE (INFLIST.MSF)

|  | 0 1 2 3 | 4 5 | 6 7 | 8 9 A B | C D E F |
|---|---|---|---|---|---|
| 0x0000 | BLK ID-INF | T-DAT | MCode | YMDhms | INF-409 |
| 0x0010 | INF-001 | | INF-002 | INF-003 | INF-004 |
| 0x0020 | INF-005 | | INF-006 | INF-007 | INF-008 |
|  | ∫ | | ∫ | ∫ | ∫ |
| 0x0660 | INF-405 | | INF-406 | INF-407 | INF-408 |
| 0x07F0 | Reserved | | | | |
| 0x0800 | DataSlot-0000 | | | | |
| 0x0810 | DataSlot-0001 | | | | |
|  | ∫ | | | | |
| 0x3FF0 | DataSlot-03 7F(895dec) | | | | |
| 0x4000 | DataSlot-03 8 0 | | | | |
|  | ∫ | | | | |
|  | DataSlot-FFFF (MAXIMUM VALUE) | | | | |

ADDITIONAL INFORMATION DATA STRUCTURE

REPRODUCING APPARATUS AND REPRODUCING METHOD

BACKGROUND OF THE INVENTION

1. Field of the Invention

The present invention relates to a reproducing apparatus and a reproducing method for reproducing files having reproduction limitation information from a record medium.

2. Description of the Related Art

EEPROM (Electrically Erasable Programmable ROM) that is an electrically rewritable memory requires a large space because each bit is composed of two transistors. Thus, the integration of EEPROM is restricted. To solve this problem, a flash memory that allows one bit to be accomplished with one transistor using all-bit-erase system has been developed. The flash memory is being expected as a successor of conventional record mediums such as magnetic disks and optical discs.

A memory card using a flash memory is also known. The memory card can be freely attached to an apparatus and detached therefrom. A digital audio recording/reproducing apparatus that uses a memory card instead of a conventional CD (Compact Disc: Trademark) or MD (Mini Disc: Trademark) can be accomplished.

On the other hand, as audio/video information is digitized and used for multi-media, the copyright protection thereof is becoming important. In the field of information services, the user will be provided with a record medium on which digitized audio/video information having particular reproduction limitation information has been recorded. In addition, digitized audio/video information having particular reproduction limitation information will be circulated to the user through digital broadcast and Internet. The user can reproduce provided or circulated audio/video information (contents) for the duration or the number of times represented by the reproduction limitation information. When necessary, the user can record desired audio/video information to a memory card at a predetermined cost.

A conventional audio reproducing apparatus does not need to limit the reproducing operation for audio/video information recorded on a record medium. However, as mentioned above, music programs are being sold as other than package media such as CDs. In such a circumstance, unlike with a conventional apparatus of which the user can freely reproduce audio/video information from a medium that he or she bought, the reproducing operation of data recorded on a medium that he or she bought may be limited. Thus, it is necessary to clearly define the reproducing operation for audio/video information and to set the number of reproduction times and the reproduction duration corresponding to the definition. In other words, when the user listens to a particular music program for 30 seconds or more, it may be determined that the music program has been reproduced one time. On the other hand, after the user has listened to the particular music program for 25 seconds and then has skipped to the next music program, it may be determined that the particular music program has not been reproduced. When the user buys a music program, if he or she listens to it only three times, he or she may buy it at a low cost.

In other words, conventionally, the user who bought a packaged medium, he or she can freely reproduce music programs therefrom. However, in very near future, a reproducing apparatus should check various reproduction limitation information assigned to media. In other words, a reproducing apparatus that does not operate corresponding to such reproduction limitation information cannot reproduce music programs having reproduction limitation information. The reproducing apparatus should manage the number of reproduction times, the reproduction duration, and so forth corresponding to the definition of the reproducing operation. Of course, values that are managed should be sufficiently secured.

OBJECT AND SUMMARY OF THE INVENTION

Therefore, an object of the present invention is to provide a reproducing apparatus and a reproducing method that allow contents to be reproduced until the number of reproduction times exceeds reproduction limitation information corresponding to a defined reproducing operation.

A first aspect of the present invention is a reproducing apparatus, comprising a memory means for recording a plurality of files and number-of-reproduction-times limitation information thereof, an operation means for selecting a desired file from the plurality of files stored in the memory means so as to reproduce the selected file, a determining means for determining whether or not the number-of-reproduction-times limitation information has been set to the file selected by the operating means, a counting means for counting the reproduced elapsed duration of the file selected by the operating means when the number-of-reproduction-times limitation information has been set to the selected file as the determined result of the determining means, a comparing means for comparing the reproduced elapsed duration counted by the counting means exceeds a predetermined value, and an editing means for editing the number-of-reproduction-times limitation information stored in the memory means when the reproduced elapsed duration counted by the counting means exceeds the predetermined value as the determined result of the comparing means.

A second aspect of the present invention is a method for reproducing a selected file from a record medium, comprising the steps of (a) causing the selected file recorded in the record medium to be reproduced, (b) determining whether or not number-of-reproduction-times limitation information has been set to the selected file, (c) counting the reproduced elapsed duration of the selected file when the number-of-reproduction-times limitation information has been set to the selected file as the determined result at step (b), (d) comparing the counted reproduced elapsed duration exceeds a predetermined value, and (e) editing the number-of-reproduction-times limitation information stored in the record medium when the reproduced elapsed duration counted at step (c) exceeds the predetermined value as the determined result at step (d).

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 11 is a schematic diagram showing the data structure of a reproduction management file PBLIST;

FIG. 12A is a schematic diagram showing the data structure of a header portion of the reproduction management file PBLIST;

FIG. 12B is a schematic diagram showing the data structure of a main data portion of the reproduction management file PBLIST;

FIG. 12C is a schematic diagram showing the data structure of an additional information data portion of the reproduction management file PBLIST;

FIG. 13 is a table that correlates showing types of additional information data and code values thereof;

FIG. 14 is a table that correlates showing types of additional information data and code values thereof;

FIG. 15 is a table that correlates showing types of additional information data and code values thereof;

FIG. 17 is a schematic diagram showing a detailed data structure of an ATRAC3 data file;

FIG. 18 is a schematic diagram showing the data structure of an upper portion of an attribute header that composes an ATRAC3 data file;

FIG. 19 is a schematic diagram showing the data structure of a middle portion of the attribute header that composes an ATRAC3 data file;

FIG. 20 is a table that correlates record modes, record time, and so forth;

FIG. 21 is a table showing copy control states;

FIG. 22 is a schematic diagram showing the data structure of a lower portion of the attribute header that composes an ATRAC3 data file;

FIG. 23 is a schematic diagram showing the data structure of a header of a data block of an ATRAC3 data file;

FIG. 27 is a schematic diagram showing the detailed data structure of the track information management file TRKLIST.MSF;

FIG. 28 is a schematic diagram showing the detailed data structure of NAME1 for managing a name;

FIG. 29 is a schematic diagram showing the detailed data structure of NAME2 for managing a name;

FIG. 30 is a schematic diagram showing the detailed data structure of an ATRAC3 data file A3Dnnnnn.MSA;

DETAILED DESCRIPTION OF THE PREFERRED EMBODIMENTS

Figure 1:
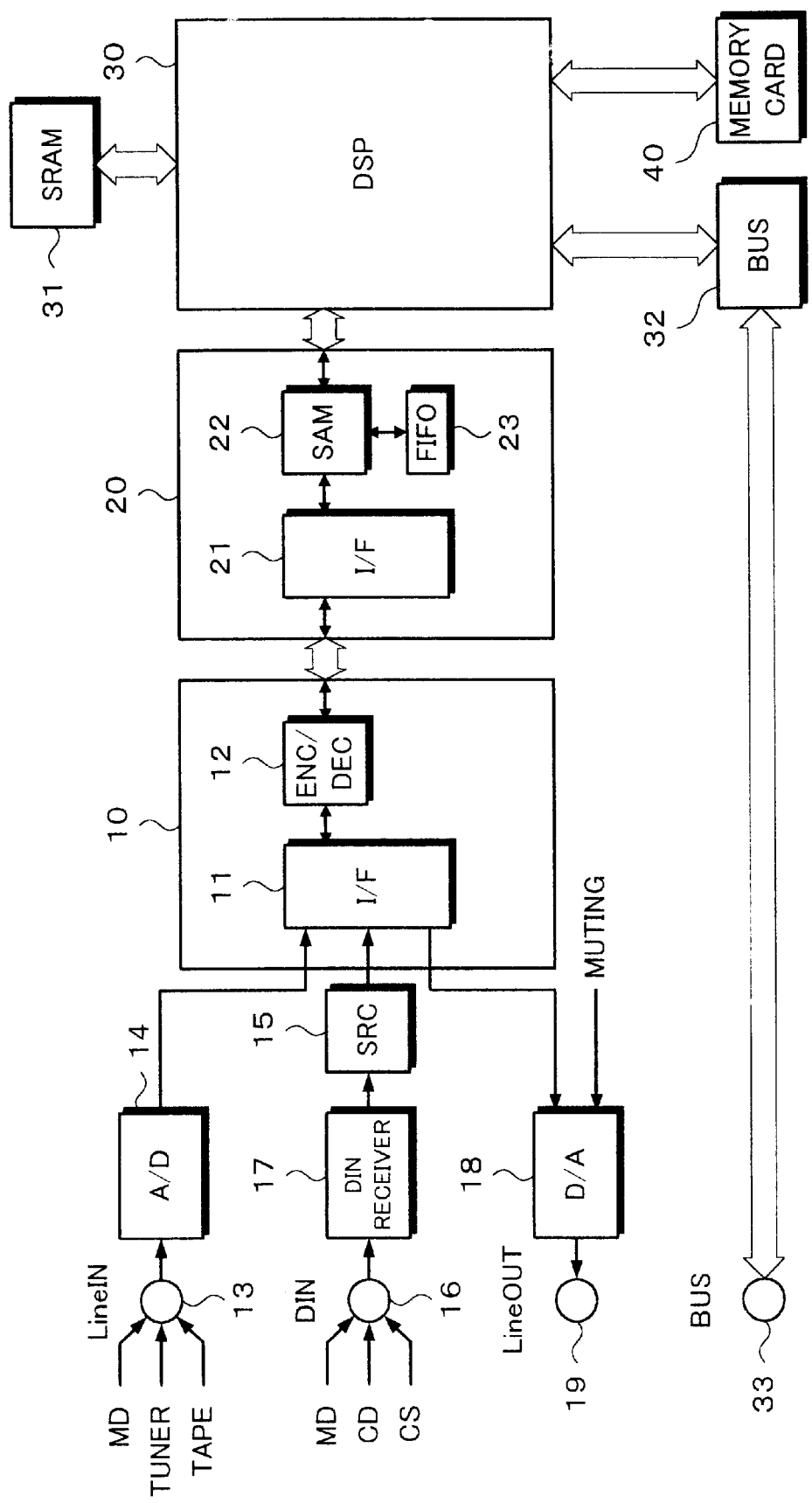
FIG. 1 is a block diagram showing the structure of a digital audio player using a nonvolatile memory card according to the present invention.

Next, an embodiment of the present invention will be described. FIG. 1 is a block diagram showing the structure of a digital audio recorder/player using a memory card according to an embodiment of the present invention. The digital audio recorder/player records and reproduces a digital audio signal using a detachable memory card. In reality, the recorder/player composes an audio system along with an amplifying unit, a speaker, a CD player, an MD recorder, a tuner, and so forth. However, it should be noted that the present invention can be applied to other audio recorders. In other words, the present invention can be applied to a portable recording/reproducing apparatus. In addition, the present invention can be applied to a set top box that records a digital audio data that is circulated as a satellite data communication, a digital broadcast, or Internet. Moreover, the present invention can be applied to a system that records/reproduces moving picture data and still picture data rather than audio data. The system according to the embodiment of the present invention can record and reproduce additional information such as picture and text other than a digital audio signal.

The recording/reproducing apparatus has an audio encoder/decoder IC 10, a security IC 20, a DSP (Digital Signal Processor) 30. Each of these devices is composed of a one-chip IC. The recording/reproducing apparatus has a detachable memory card 40. The one-chip IC of the memory card 40 has flash memory (nonvolatile memory), a memory control block, and a security block. The security block has a DES (Data Encryption Standard) encrypting circuit. According to the embodiment, the recording/reproducing apparatus may use a microcomputer instead of the DSP 30.

The audio encoder/decoder IC 10 has an audio interface 11 and an encoder/decoder block 12. The encoder/decoder block 12 encodes a digital audio data corresponding to a highly efficient encoding method and writes the encoded data to the memory card 40. In addition, the encoder/decoder block 12 decodes encoded data that is read from the memory card 40. As the highly efficient encoding method, the ATRAC3 format that is a modification of the ATRAC (Adaptive Transform Acoustic Coding) format used in Mini-Disc is used.

In the ATRAC3 format, audio data sampled at 44.1 kHz and quantized with 16 bits is highly efficiently encoded. In the ATRAC3 format, the minimum data unit of audio data that is processed is a sound unit (SU). 1 SU is data of which data of 1024 samples (1024×16 bits×2 channels) is compressed to data of several hundred bytes. The duration of 1 SU is around 23 msec. In the highly efficient encoding method, the data amount of audio data is compressed to data that is around 10 times smaller than that of original data. As with the ATRAC1 format used in Mini-Disc, the audio signal compressed and decompressed corresponding to the ATRAC3 format less deteriorates in the audio quality.

A line input selector 13 selectively supplies the reproduction output signal of an MD, the output signal of a tuner, or a reproduction output signal of a tape to an A/D converter 14. The A/D converter 14 converts the input line signal to a digital audio signal (sampling frequency=44.1 kHz; the number of quantizing bits=16). A digital input selector 16 selectively supplies a digital output signal of an MD, a CD, or a CS (Satellite Digital Broadcast) to a digital input receiver 17. The digital input signal is transmitted through for example an optical cable. An output signal of the digital input receiver 17 is supplied to a sampling rate converter 15. The sampling rate converter 15 converts the digital input signal into a digital audio signal (sampling frequency=44.1 kHz; the number of quantizing bits=16).

The encoder/decoder block 12 of the audio encoder/decoder IC 10 supplies encoded data to a DES encrypting circuit 22 through an interface 21 of the security IC 20. The DES encrypting circuit 22 has a FIFO 23. The DES encrypting circuit 22 is disposed so as to protect the copyright of contents. The memory card 40 also has a DES encrypting circuit. The DES encrypting circuit 22 of the recording/reproducing apparatus has a plurality of master keys and an apparatus-unique storage key. The DES encrypting circuit 22 also has a random number generating circuit. The DES encrypting circuit 22 can share an authenticating process and a session key with the memory card 40 that has the DES encrypting circuit. In addition, the DES encrypting circuit 22 can re-encrypt data with the storage key of the DES encrypting circuit.

The encrypted audio data that is output from the DES encrypting circuit 22 is supplied to a DSP (Digital Signal Processor) 30. The DSP 30 communicates with the memory card 40 through an interface. In this example, the memory card 40 is attached to an attaching/detaching mechanism (not shown) of the recording/reproducing apparatus. The DSP 30 writes the encrypted data to the flash memory of the memory card 40. The encrypted data is serially transmitted between the DSP 30 and the memory card 40. In addition, an external SRAM (Static Random Access Memory) 31 is connected to the DSP 30. The SRAM 31 provides the recording/reproducing apparatus with a sufficient storage capacity so as to control the memory card 40.

A bus interface 32 is connected to the DSP 30. Data is supplied from an external controller (not shown) to the DSP 30 through a bus 33. The external controller controls all operations of the audio system. The external controller supplies data such as a record command or a reproduction command that is generated corresponding to a user's operation through an operation portion to the DSP 30 through the bus interface 32. In addition, the external controller supplies additional information such as image information and character information to the DSP 30 through the bus interface 32. The bus 33 is a bidirectional communication path. Additional information that is read from the memory card 40 is supplied to the external controller through the DSP 30, the bus interface 32, and the bus 33. In reality, the external controller is disposed in for example an amplifying unit of the audio system. In addition, the external controller causes a display portion to display additional information, the operation state of the recorder, and so forth. The display portion is shared by the audio system. Since data that is exchanged through the bus 33 is not copyright protected data, it is not encrypted.

The encrypted audio data that is read from the memory card 40 by the DSP 30 is decrypted by the security IC 20. The audio encoder/decoder IC 10 decodes the encoded data corresponding to the ATRAC3 format. Output data of the audio encoder/decoder 10 is supplied to a D/A converter 18. The D/A converter 18 converts the output data of the audio encoder/decoder 10 into an analog signal. The analog audio signal is supplied to a line output terminal 19.

The analog audio signal is supplied to an amplifying unit (not shown) through the line output terminal 19. The analog audio signal is reproduced from a speaker or a head set. The external controller supplies a muting signal to the D/A converter 18. When the muting signal represents a mute-on state, the external controller prohibits the audio signal from being output from the line output terminal 19.

Figure 2:
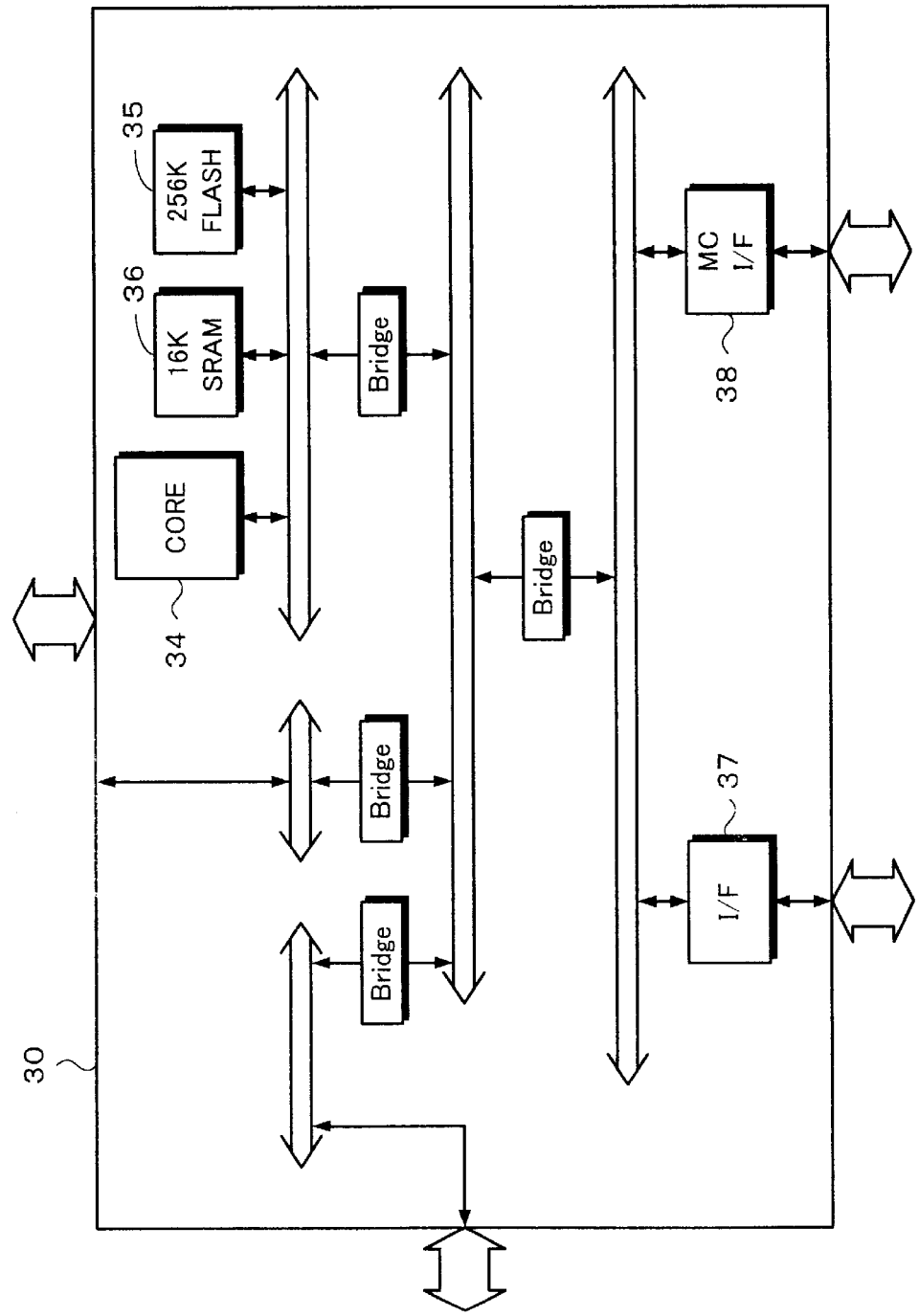
FIG. 2 is a block diagram showing the internal structure of a DSP 30 according to the present invention.

FIG. 2 is a block diagram showing the internal structure of the DSP 30. Referring to FIG. 2, the DSP 30 comprises a core 34, a flash memory 35, an SRAM 36, a bus interface 37, a memory card interface 38, and inter-bus bridges. The DSP 30 has the same function as a microcomputer. The core 34 is equivalent to a CPU. The flash memory 35 stores a program that causes the DSP 30 to perform predetermined processes. The SRAM 36 and the external SRAM 31 are used as a RAM of the recording/reproducing apparatus.

The DSP 30 controls a writing process for writing encrypted audio data and additional information to the memory card 40 corresponding to an operation signal such as a record command received through the bus interfaces 32 and 37 and a reading process for reading them therefrom. In other words, the DSP 30 is disposed between the application software side of the audio system that records/reproduces audio data and additional information and the memory card 40. The DSP 30 is operated when the memory card 40 is accessed. In addition, the DSP 30 is operated corresponding to software such as a file system.

The DSP 30 manages files stored in the memory card 40 with the FAT system used in conventional personal computers. In addition to the file system, according to the embodiment of the present invention, a management file is used. The management file will be described later. The management file is used to manage data files stored in the memory card 40. The management file as the first file management information is used to manage audio data files. On the other hand, the FAT as the second file management information is used to mange all files including audio data files and management files stored in the flash memory of the memory card 40. The management file is stored in the memory card 40. The FAT is written to the flash memory along with the route directory and so forth before the memory card 40 is shipped. The details of the FAT will be described later.

According to the embodiment of the present invention, to protect the copyright of data, audio data that has been compressed corresponding to the ATRAC3 format is encrypted. On the other hand, since it is not necessary to protect the copyright of the management file, it is not encrypted. There are two types of memory cards that are an encryption type and a non-encryption type. However, a memory card for use with the recorder/player that records copyright protected data is limited to the encryption type.

Voice data and image data that are recorded by users are recorded on non-encryption type memory cards.

Figure 3:
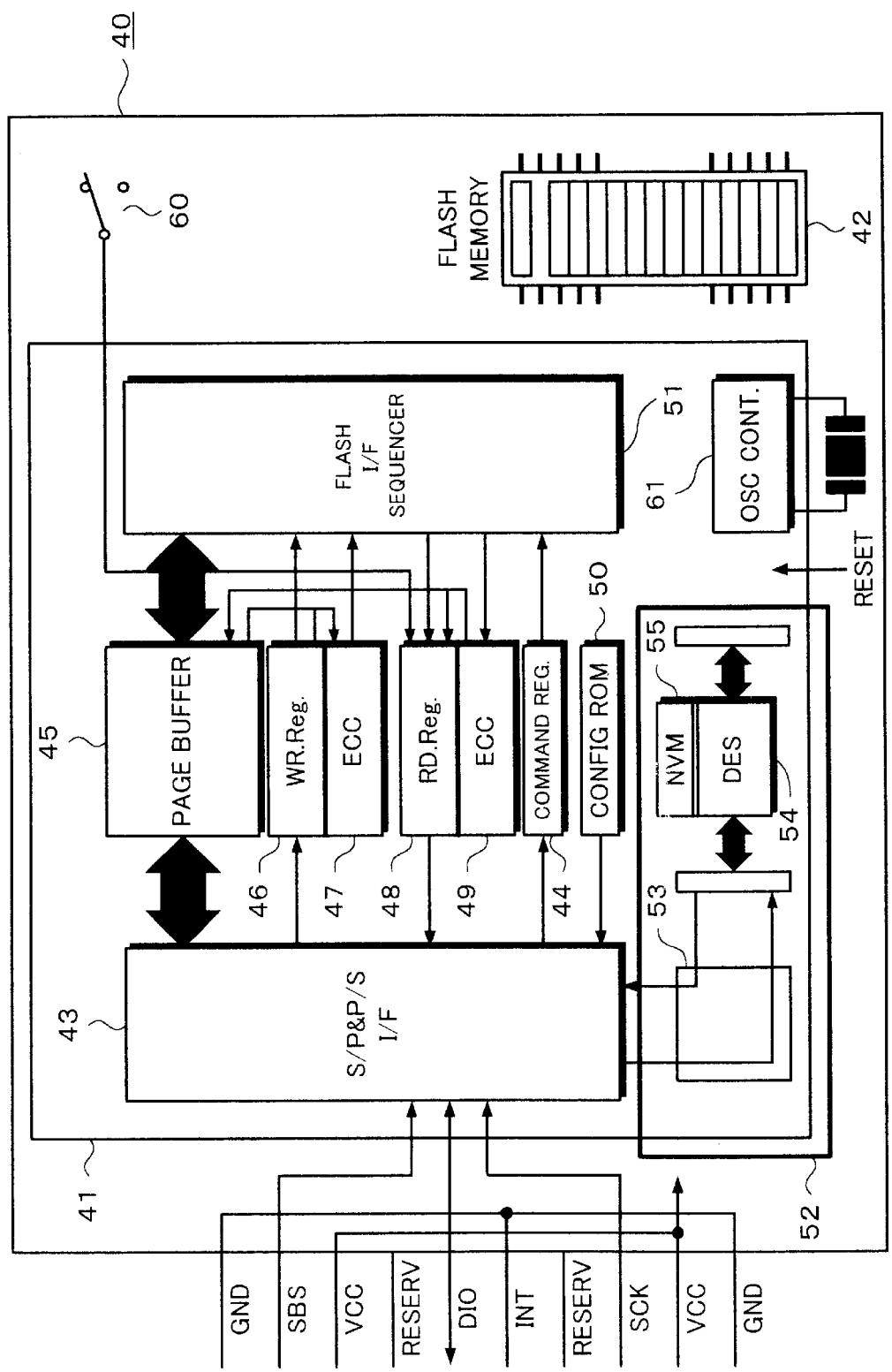
FIG. 3 is a block diagram showing the internal structure of a memory card 40 according to the present invention.

FIG. 3 is a block diagram showing the internal structure of the memory card 40. The memory card 40 comprises a control block 41 and a flash memory 42 that are structured as a one-chip IC. A bidirectional serial interface is disposed between the DSP 30 of the recorder/player and the memory card 40. The bidirectional serial interface is composed of ten lines that are a clock line SCK for transmitting a clock signal that is transmitted along with data, a status line SBS for transmitting a signal that represents a status, a data line DIO for transmitting data, an interrupt line INT, two GND lines, two INT lines, and two reserved lines.

The clock line SCK is used for transmitting a clock signal in synchronization with data. The status line SBS is used for transmitting a signal that represents the status of the memory card 40. The data line DIO is used for inputting and outputting a command and encrypted audio data. The interrupt line INT is used for transmitting an interrupt signal that causes the memory card 40 to interrupt the DSP 30 of the recorder/player. When the memory card 40 is attached to the recorder/player, the memory card 40 generates the interrupt signal. However, according to the embodiment of the present invention, since the interrupt signal is transmitted through the data line DIO, the interrupt line INT is grounded.

A serial/parallel converting, parallel/serial converting, and interface block (S/P, P/S, I/F block) 43 is an interface disposed between the DSP 30 of the recorder/player and the control block 41 of the memory card 40. The S/P, P/S, and IF block 43 converts serial data received from the DSP 30 of the recorder/player into parallel data and supplies the parallel data to the control block 41. In addition, the S/P, P/S, and IF block 43 converts parallel data received from the control block 41 into serial data and supplies the serial data to the DSP 30. When the S/P, P/S, and IF block 43 receives a command and data through the data line DIO, the S/P, P/S, and IF block 43 separates them into these that are normally accessed to the flash memory 42 and those that are encrypted.

In the format of which data is transmitted through the data line DIO, after a command is transmitted, data is transmitted. The S/P, P/S, and IF block 43 detects the code of a command and determines whether the command and data are those that are normally accessed or those that are encoded. Corresponding to the determined result, the S/P, P/S, and IF block 43 stores a command that is normally accessed to a command register 44 and stores data that is normally accessed to a page buffer 45 and a write register 46. In association with the write register 46, the memory card 40 has an error correction code encoding circuit 47. The error correction code encoding circuit 47 generates a redundant code that is an error correction code for data temporarily stored in the page buffer 45.

Output data of the command register 44, the page buffer 45, the write register 46, and the error correction code encoding circuit 47 is supplied to a flash memory interface and sequencer (hereinafter, referred to as memory I/F and sequencer) 51. The memory IF and sequencer 51 is an interface disposed between the control block 41 and the flash memory 42 and controls data exchanged therebetween. Data is written to the flash memory through the memory IF and sequencer 51.

Audio data that has been compressed corresponding to the ATRAC3 format and written to the flash memory (hereinafter, this audio data is referred to as ATRAC3 data) is encrypted by the security IC 20 of the recorder/player and the security block 52 of the memory card 40 so as to protect the copyright of the ATRAC3 data. The security block 52 comprises a buffer memory 53, a DES encrypting circuit 54, and a nonvolatile memory 55.

The security block 52 of the memory card 40 has a plurality of authentication keys and a unique storage key for each memory card. The nonvolatile memory 55 stores a key necessary for encrypting data. The key stored in the nonvolatile memory 55 cannot be analyzed. According to the embodiment, for example, a storage key is stored in the nonvolatile memory 55. The security block 52 also has a random number generating circuit. The security block 52 authenticates an applicable recorder/player and shares a session key therewith. In addition, the security block 52 re-encrypts contents with the storage key through the DSE encrypting circuit 54.

For example, when the memory card 40 is attached to the recorder/player, they are mutually authenticated. The security IC 20 of the recorder/player and the security block 52 of the memory card 40 mutually authenticate. When the recorder/player has authenticated the attached memory card 40 as an applicable memory card and the memory card 40 has authenticated the recorder/player as an applicable recorder/player, they are mutually authenticated. After the mutual authenticating process has been successfully performed, the recorder/player and the memory card 40 generate respective session keys and share them with each other. Whenever the recorder/player and the memory card 40 authenticate each other, they generate respective session keys.

When contents are written to the memory card 40, the recorder/player encrypts a contents key with a session key and supplies the encrypted data to the memory card 40. The memory card 40 decrypts the contents key with the session key, re-encrypts the contents key with a storage key, and supplies the contents key to the recorder/player. The storage key is a unique key for each memory card 40. When the recorder/player receives the encrypted contents key, the recorder/player performs a formatting process for the encrypted contents key, and writes the encrypted contents key and the encrypted contents to the memory card 40.

In the above section, the writing process for the memory card 40 was described. In the following, the reading process for the memory card 40 will be described. Data that is read from the flash memory 42 is supplied to the page buffer 45, the read register 48, and the error correction circuit 49 through the memory IF and the sequencer 51. The error correcting circuit 49 corrects an error of the data stored in the page buffer 45. Output data of the page buffer 45 that has been error-corrected and the output data of the read register 48 are supplied to the S/P, P/S, and IF block 43. The output data of the S/P, P/S, and IF block 43 is supplied to the DSP 30 of the recorder/player through the above-described serial interface.

When data is read from the memory card 40, the contents key encrypted with the storage key and the contents key encrypted with the block key are read from the flash memory 42. The security block 52 decrypts the contents key with the storage key. The security block 52 re-encrypts the decrypted content key with the session key and transmits the re-encrypted contents key to the recorder/player. The recorder/player decrypts the contents key with the received session key and generates a block key with the decrypted contents key. The recorder/player successively decrypts the encrypted ATRAC3 data.

A config. ROM 50 is a memory that stores partition information, various types of attribute information, and so forth of the memory card 40. The memory card 40 also has an erase protection switch 60. When the switch 60 is in the erase protection position, even if a command that causes the memory card 40 to erase data stored in the flash memory 42 is supplied from the recorder/player side to the memory card 40, the memory card 40 is prohibited from erasing the data stored in the flash memory 42. An OSC cont. 61 is an oscillator that generates a clock signal that is the reference of the timing of the process of the memory card 40.

Figure 4:
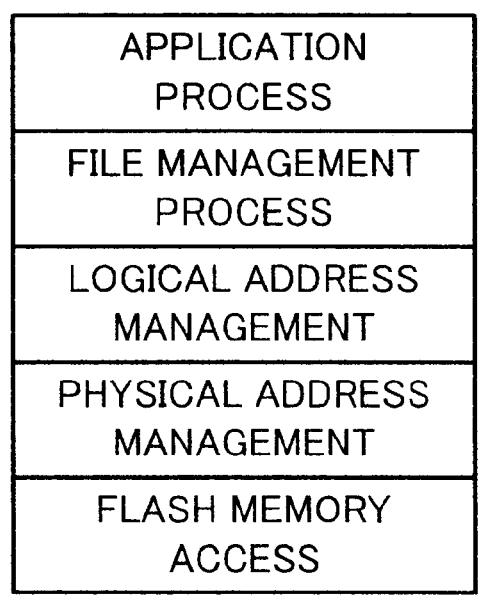
FIG. 4 is a schematic diagram showing a file management structure of a memory card as a storage medium according to the present invention.

FIG. 4 is a schematic diagram showing the hierarchy of the processes of the file system of the computer system that uses a memory card as a storage medium. On the hierarchy, the top hierarchical level is an application process layer. The application process layer is followed by a file management process layer, a logical address management layer, a physical address management layer, and a flash memory access layer. In the above-mentioned hierarchical structure, the file management process layer is the FAT file system. Physical addresses are assigned to individual blocks of the flash memory. The relation between the blocks of the flash memory and the physical addresses thereof does not vary. Logical addresses are addresses that are logically handled on the file management process layer.

Figure 5:
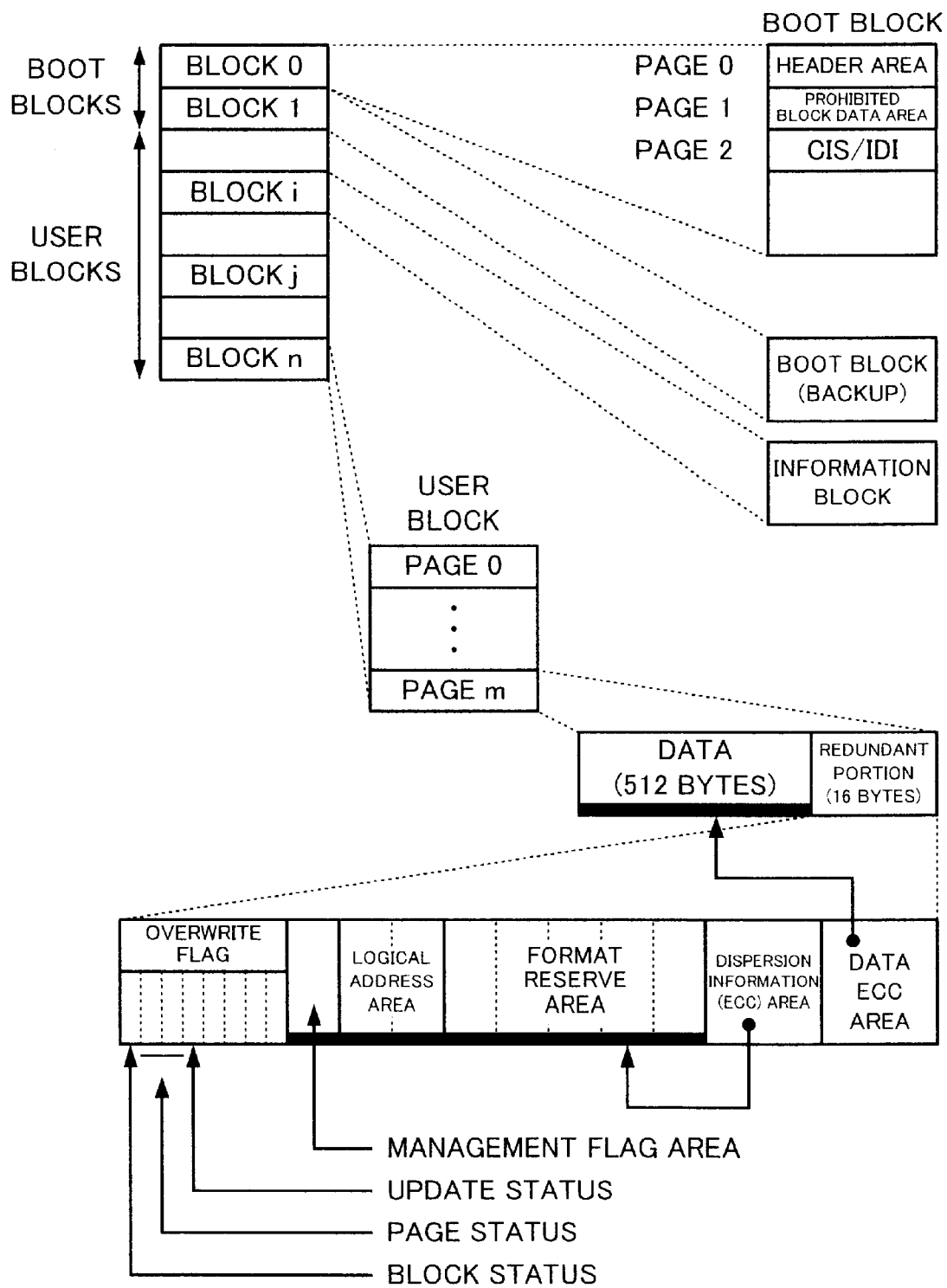
FIG. 5 is a schematic diagram showing the physical structure of data in a flash memory 42 of the memory card 40 according to the present invention.

FIG. 5 is a schematic diagram showing the physical structure of data handled in the flash memory 42 of the memory card 40. In the memory 42, a data unit (referred to as segment) is divided into a predetermined number of blocks (fixed length). One block is divided into a predetermined number of pages (fixed length). In the flash memory, data is erased as each block at a time. Data is written to the flash memory 42 or read therefrom as a page at a time. The size of each block is the same. Likewise, the size of each page is the same. One block is composed of page 0 to page m. For example, one block has a storage capacity of for example 8 KB (kilobytes) or 16 KB. One page has a storage capacity of 512 B (bytes). When one block has a storage capacity of 8 KB, the total storage capacity of the flash memory 42 is 4 MB (512 blocks) or 8 MB (1024 blocks). When one block has a storage capacity of 16 KB, the total storage capacity of the flash memory 42 is 16 MB (1024 blocks), 32 MB (2048 blocks), or 64 MB (4096 blocks).

One page is composed of a data portion of 512 bytes and a redundant portion of 16 bytes. The first three bytes of the redundant portion is an overwrite portion that is rewritten whenever data is updated. The first three bytes successively contain a block status area, a page status area, and an update status area. The remaining 13 bytes of the redundant portion are fixed data that depends on the contents of the data portion. The 13 bytes contain a management flag area (1 byte), a logical address area (2 bytes), a format reserve area (5 bytes), a dispersion information ECC area (2 bytes), and a data ECC area (3 bytes). The dispersion information ECC area contains redundant data for an error correction process against the management flag area, the logical address area, and the format reserve area. The data ECC area contains redundant data for an error correction process against 512-byte data.

The management flag area contains a system flag (1: user block, 0: boot block), a conversion table flag (1: invalid, 0: table block), a copy prohibition flag (1: OK, 0: NG), and an access permission flag (1: free, 0: read protect).

The first two blocks—blocks 0 and 1 are boot blocks. The block 1 is a backup of the block 0. The boot blocks are top blocks that are valid in the memory card. When the memory card is attached to the recorder/player, the boot blocks are accessed at first. The remaining blocks are user blocks. Page 0 of the boot block contains a header area, a system entry area, and a boot and attribute information area. Page 1 of the boot block contains a prohibited block data area. Page 2 of the boot block contains a CIS (Card Information Structure)/ IDI (identify Drive Information) area.

The header area of the boot block contains a boot block ID and the number of effective entries. The system entries are the start position of prohibited block data, the data size thereof, the data type thereof, the data start position of the CIS/IDI area, the data size thereof, and the data type thereof. The boot and attribute information contains the memory card type (read only type, rewritable type, or hybrid type), the block size, the number of blocks, the number of total blocks, the security/non-security type, the card fabrication data (date of fabrication), and so forth.

Since the flash memory has a restriction for the number of rewrite times due to the deterioration of the insulation film, it is necessary to prevent the same storage area (block) from being concentratedly accessed. Thus, when data at a particular logical address stored at a particular physical address is rewritten, updated data of a particular block is written to a non-used block rather than the original block. Thus, after data is updated, the relation between the logical address and the physical address changes. This process is referred to as swap process. Consequently, the same block is prevented from being concentratedly accessed. Thus, the service life of the flash memory can be prolonged.

The logical address associates with data written to the block. Even if the block of the original data is different from the block of updated data, the address on the FAT does not change. Thus, the same data can be properly accessed. However, since the swap process is performed, a conversion table that correlates logical addresses and physical addresses is required (this table is referred to as logical-physical address conversion table). With reference to the logical-physical address conversion table, a physical address corresponding to a logical address designated on the FAT is obtained. Thus, a block designated with a physical address can be accessed.

The DSP 30 stores the logical-physical address conversion table in the SRAM. When the storage capacity of the RAM is small, the logical-physical address conversion table can be stored to the flash memory. The logical-physical address conversion table correlates logical addresses (2 bytes) sorted in the ascending order with physical addresses (2 bytes).

Since the maximum storage capacity of the flash memory is 128 MB (8192 blocks), 8192 addresses can be assigned with two bytes. The logical-physical address conversion table is managed for each segment. Thus, the size of the logical-physical address conversion table is proportional to the storage capacity of the flash memory. When the storage capacity of the flash memory is 8 MB (two segments), two pages are used as the logical-physical address conversion table for each of the segments. When the conversion table is stored in the flash memory, a predetermined one bit of the management flag area in the redundant portion in each page represents whether or not the current block is a block containing the logical-physical address conversion table.

The above-described memory card can be used with the FAT file system of a personal computer system as with the disc shaped record medium. The flash memory has an IPL area, a FAT area, and a route directory area (not shown in FIG. 5). The IPL area contains the address of a program to be initially loaded to the memory of the recorder/player. In addition, the IPL area contains various types of memory information. The FAT area contains information with respect to blocks (clusters). The FAT has defined unused blocks, next block number, defective blocks, and last block number. The route directory area contains directory entries that are a file attribute, an update date [day, month, year], file size, and so forth.

Next, with reference to FIG. 6, a managing method using the FAT table will be described.

Figure 6:
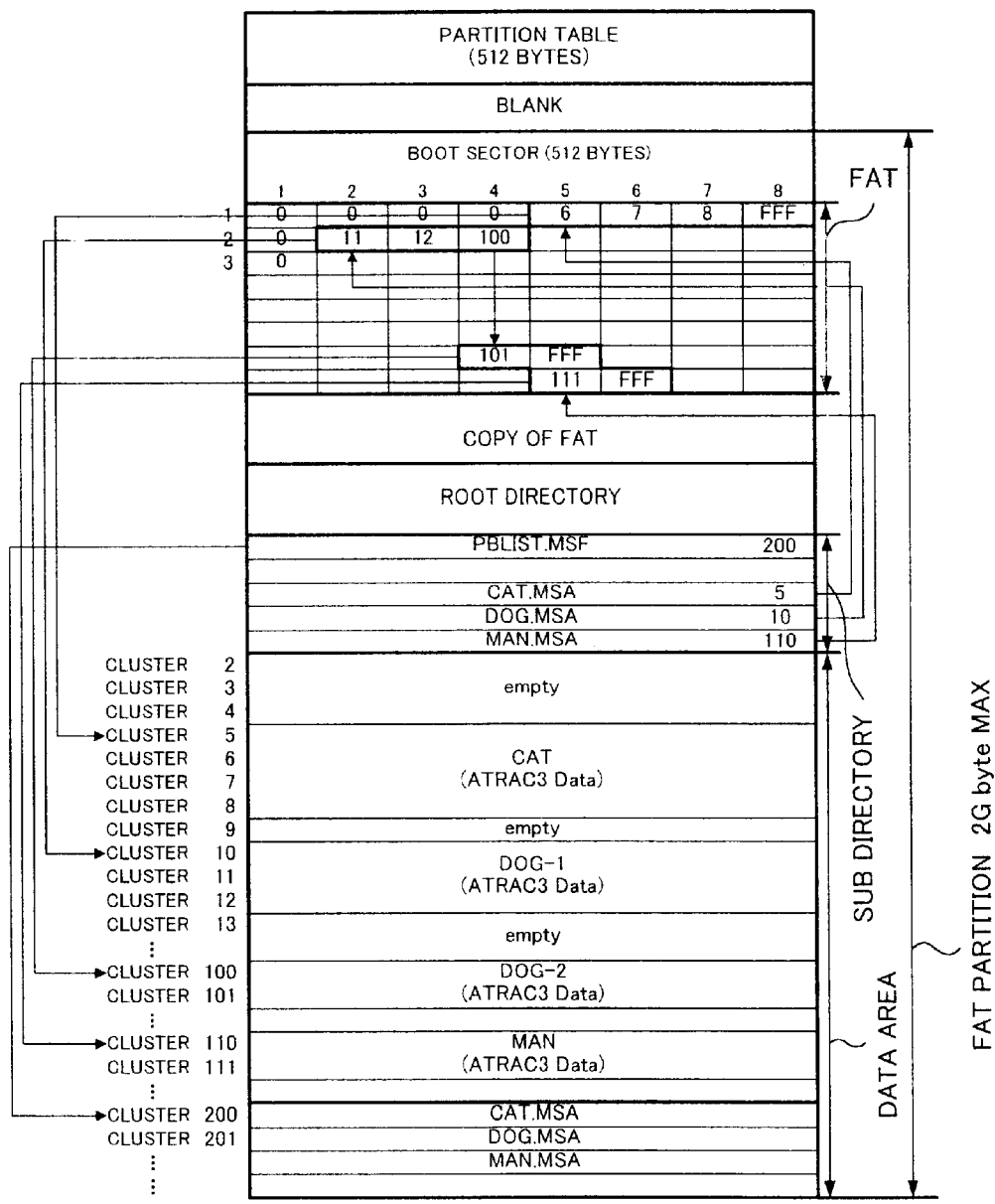
FIG. 6 is a data structure of the memory card 40 according to the present invention.

FIG. 6 is a schematic diagram showing a memory map. The top area of the memory map is a partition table portion. The partition table portion is followed by a block area, a boot sector, a FAT area, a FAT backup area, a root directory area, a sub directory area, and a data area. On the memory map, logical addresses have been converted into physical addresses corresponding to the logical-physical address conversion table.

The boot sector, the FAT area, the FAT backup area, the root directory area, the sub directory area, and the data area are referred to as FAT partition area.

The partition table portion contains the start address and the end address of the FAT partition area.

The FAT used for a conventional floppy disk does not have such a partition table. Since the first track has only a partition table, there is a blank area. The boot sector contains the size of the FAT structure (12bit FAT or 16 bit FAT), the cluster size, and the size of each area. The FAT is used to manage the position of a file recorded in the data area. The FAT copy area is a FAT backup area. The route directory area contains file names, start cluster addresses thereof, and various attributes thereof. The route directory area uses 32 bytes per file.

The sub directory area is achieved by a directory attribute file as a directory. In the embodiment shown in FIG. 6, the sub directory area has four files named PBLIST.MSF, CAT.MSF, DOG.MSF, and MAN.MFA. The sub directory area is used to manage file names and record positions on the FAT. In other words, the slot of the file name CAT.MSF is assigned address "10" on the FAT. The slot of the file name DOG.MSF is assigned address "10" on the FAT. An area after cluster 2 is used as a data area. In this embodiment, audio data that has been compressed corresponding to the ATRAC3 format is recorded. The top slot of the file name MAN.MSA is assigned address "110" on the FAT. According to the embodiment of the present invention, audio data with the file name CAT.MSF is recorded to cluster 5 to 8. Audio data of DOG-1 as the first half of the file with the file name DOG.MSF is recorded to clusters 10 to 12. Audio data DOG-2 as the second half of the file with the file name DOG.MSF is recorded in clusters 100 and 101. Audio data with the file name MAN.MSF is recorded in clusters 110 and 111.

In the embodiment of the present invention, an example of which a single file is divided into two portions and dispersedly recorded is described. In the embodiment, an area "Empty" in the data area is a recordable area. An area after cluster 200 is used for managing file names. The file CAT.MSF is recorded to cluster 200. The file DOG.MSF is recorded to cluster 201. The file MAN.MSF is recorded to cluster 202. When the positions of the files are changed, the area after cluster 200 is re-arranged. When the memory card is attached, the beginning and the end of the FAT partition area are recorded with reference to the top partition table portion. After the boot sector portion is reproduced, the root directory area and the sub directory area are reproduced. The slot of the reproduction management information PBLIST-.MSF in the sub directory area is detected. Thus, the address of the end portion of the slot of the file PBLIST.MSF is obtained. In the embodiment, since address "200" is recorded at the end of the file PBLIST.MSF, cluster 200 is referenced.

The area after cluster 200 is used for managing the reproduction order of files. In the embodiment, the file CAT.MSA is the first program. The file DOG.MSA is the second program. The file MAN.MSA is the third program. After the area after cluster 200 is referenced, slots of the files CAT.MSA, DOG.MSA, and MAN.MSA are referenced. In FIG. 6, the end of the slot of the file CAT.MSA is assigned address "5". The end of the slot of the file DOG.MSA is assigned address "10". The end of the slot of the file MAN.MSA is assigned address "110". When an entry address is searched on the FAT with address "5", cluster address "6" is obtained. When an entry address is searched on the FAT with address "6", cluster address "7" is obtained. When an entry address is searched on the FAT with address "8", code "FFF" that represents the end is obtained. Thus, the file CAT.MSA uses clusters 5, 6, 7, and 8. With reference to clusters 5, 6, 7, and 8 in the data area, an area of ATRAC3 data with the file name CAT.MSA can be accessed.

Next, a method for searching the file DOG.MSF that has been dispersedly recorded will be described. The end of the slot of the file DOG.MSA is assigned address "10". When an entry address on the FAT is searched with address "10", cluster address "11" is obtained. When an entry address on the FAT is searched with address "11" is referenced, cluster address "12" is obtained. When an entry address on the FAT is searched with address "12" is referenced, cluster address "101" is obtained. When entry address "101" is referenced, code "FFF" that represents the end is obtained. Thus, the file DOG.MSF uses clusters 10, 11, 12, 100, and 101. When clusters 10, 11, and 12 are referenced, the first part of ATRAC3 data of the file DOG.MSF can be accessed. When the clusters 100 and 101 are referenced, the second part of ATRAC3 data of the file DOG.MSF can be accessed. In addition, when an entry address is searched on the FAT with address "110", cluster address "101" is obtained. When an entry address "111" is searched on the FAT with address "101", code "FFF" that represents the end is obtained. Thus, it is clear that the file MAN.MSA uses clusters 110 and 111. As described above, data files dispersed in the flash memory can be linked and sequentially reproduced.

According to the embodiment of the present invention, in addition to the file management system defined in the format of the memory card 40, the management file is used for managing tracks and parts of music files. The management file is recorded to a user block of the flash memory 42 of the memory card 40. Thus, as will be described later, even if the FAT of the memory card 40 is destroyed, a file can be recovered.

The management file is generated by the DSP 30. When the power of the recorder/player is turned on, the DSP 30 determines whether or not the memory card 40 has been attached to the recorder/player. When the memory card has been attached, the DSP 30 authenticates the memory card 40. When the DSP 30 has successfully authenticated the memory card 40, the DSP 30 reads the boot block of the flash memory 42. Thus, the DSP 30 reads the physical-logical address conversion table and stores the read data to the SRAM. The FAT and the route directory have been written to the flash memory of the memory card 40 before the memory card 40 is shipped. When data is recorded to the memory card 40, the management file is generated.

In other words, a record command issued by the remote controller of the user or the like is supplied to the DSP 30 from the external controller through the bus and the bus interface 32. The encoder/decoder IC 10 compresses the received audio data and supplies the resultant ATRAC3 data to the security IC 20. The security IC 20 encrypts the ATRAC3 data. The encrypted ATRAC3 data is recorded to the flash memory 42 of the memory card 40. Thereafter, the FAT and the management file are updated. Whenever a file is updated (in reality, whenever the recording process of audio data is completed), the FAT and the management file stored in the SRAMs 31 and 36 are rewritten. When the memory card 40 is detached or the power of the recorder/player is turned off, the FAT and the management file that are finally supplied from the SRAMs 31 and 36 are recorded to the flash memory 42.

Alternatively, whenever the recording process of audio data is completed, the FAT and the management file written in the flash memory 42 may be rewritten. When audio data is edited, the contents of the management file are updated.

In the data structure according to the embodiment, additional information is contained in the management file. The additional information is updated and recorded to the flash memory 42. In another data structure of the management file, an additional information management file is generated besides the track management file. The additional information is supplied from the external controller to the DSP 30 through the bus and the bus interface 32. The additional information is recorded to the flash memory 42 of the memory card 40. Since the additional information is not supplied to the security IC 20, it is not encrypted. When the memory card 40 is detached from the recorder/player or the power thereof is turned off, the additional information is written from the SRAM of the DSP 30 to the flash memory 42.

Figure 7:
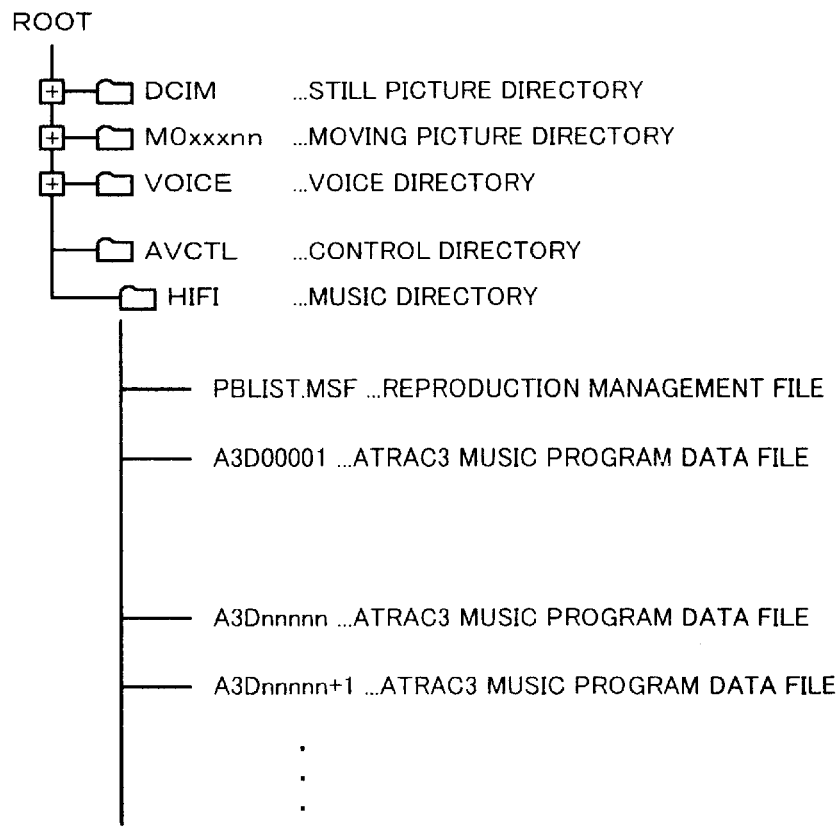
FIG. 7 is a schematic diagram showing the hierarchy of the file structure in the memory card 40.

FIG. 7 is a schematic diagram showing the file structure of the memory card 40. As the file structure, there are a still picture directory, a moving picture directory, a voice directory, a control directory, and a music (HIFI) directory. According to the embodiment, music programs are recorded and reproduced. Next, the music directory will be described. The music directory has two types of files. The first type is a reproduction management file BLIST.MSF (hereinafter, referred to as PBLIST). The other type is an ATRAC3 data file A3Dnnnn.MSA that stores encrypted music data. The music directory can stores up to 400 ATRAC3 data files (namely, 400 music programs). ATRAC3 data files are registered to the reproduction management file and generated by the recorder/player.

Figure 8:
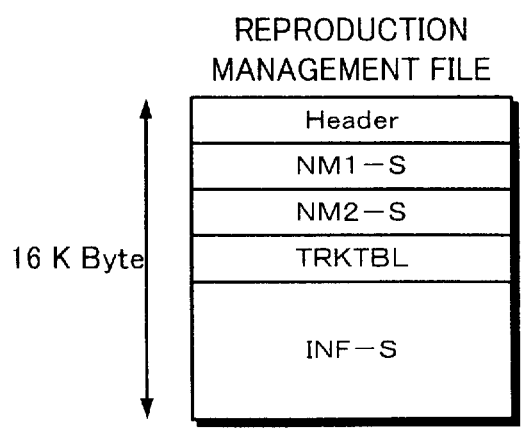
FIG. 8 is a schematic diagram showing the data structure of a reproduction management file PBLIST.MSF that is a sub directory stored in the memory card 40.
Figure 9:
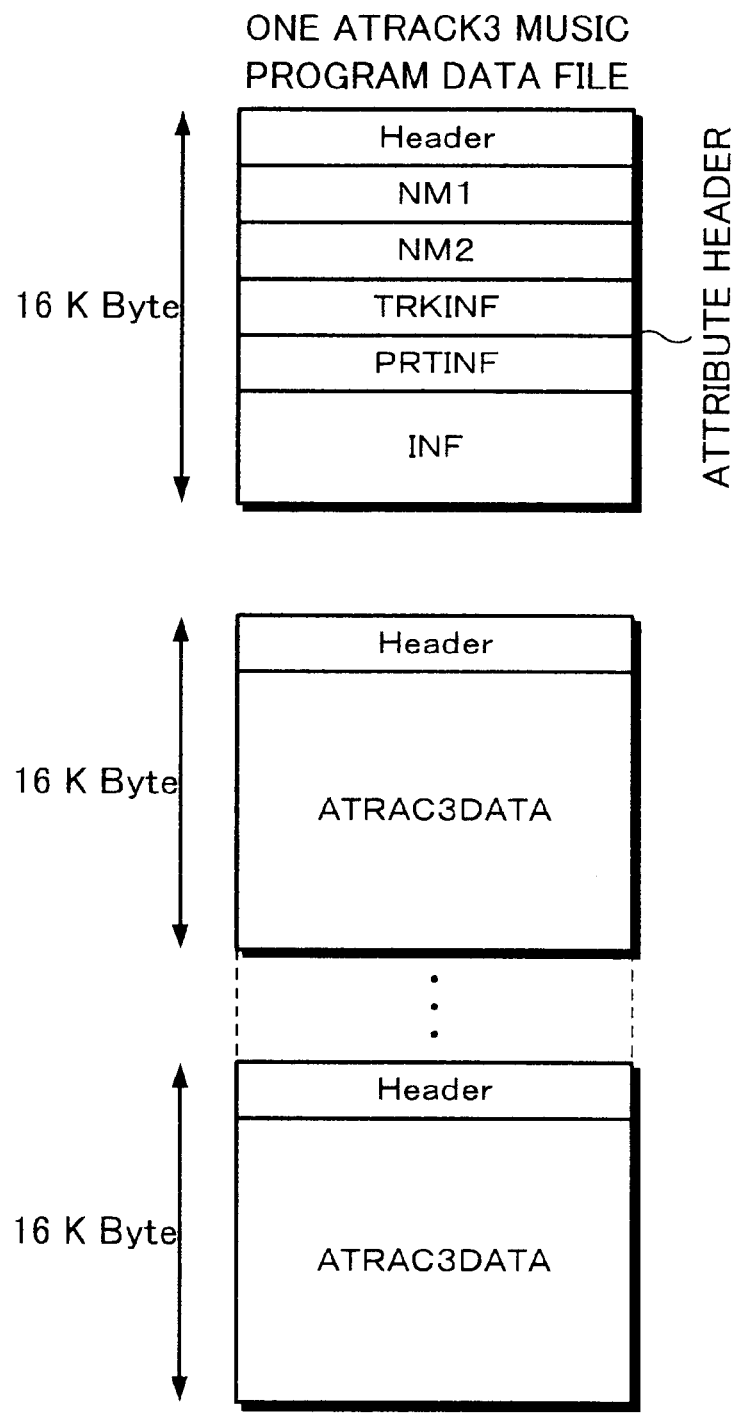
FIG. 9 is a schematic diagram showing the data structure in the case that one ATRAC3 data file is divided into blocks with a predetermined unit length and that attribute files are added thereto.

FIG. 8 is a schematic diagram showing the structure of the reproduction management file. FIG. 9 is a schematic diagram showing the file structure of one ATRAC3 data file. The reproduction management file is a fixed-length file of 16 KB. An ATRAC3 data file is composed of an attribute header and an encrypted music data area for each music program. The attribute data has a fixed length of 16 KB. The structure of the attribute header is similar to that of the reproduction management file.

The reproduction management file shown in FIG. 8 is composed of a header, a memory card name NM-1S (for one byte code), a memory card name NM2-S (for two byte code), a program reproduction sequence table TRKTBL, and memory card additional information INF-S. The attribute header (shown in FIG. 9) at the beginning of the data file is composed of a header, a program name NM1 (for one byte code), a program name NM2 (for two byte code), track information TRKINF (such as track key information), part information PRTINF, and track additional information INF. The header contains information of the number of total parts, the attribute of the name, the size of the additional information, and so forth.

The attribute data is followed by ATRAC3 music data. The music data is block-segmented every 16 KB. Each block starts with a header. The header contains an initial value for decrypting encrypted data. Only music data of an ATRAC3 data file is encrypted. Thus, other data such as the reproduction management file, the header, and so forth are not encrypted.

Next, with reference to FIGS. 10A to 10C, the relation between music programs and ATRAC3 data files will be described. One track is equivalent to one music program. In addition, one music program is composed of one ATRAC3 data (see FIG. 9). The ATRAC3 data file is audio data that has been compressed corresponding to the ATRAC3 format. The ATRAC3 data file is recorded as a cluster at a time to the memory card 40. One cluster has a capacity of 16 KB. A plurality of files are not contained in one cluster. The minimum data erase unit of the flash memory 42 is one block. In the case of the memory card 40 for music data, a block is a synonym of a cluster. In addition, one cluster is equivalent to one sector.

One music program is basically composed of one part. However, when a music program is edited, one music program may be composed of a plurality of parts. A part is a unit of data that is successively recorded. Normally, one track is composed of one part. The connection of parts of a music program is managed with part information PRTINF in the attribute header of each music program. In other words, the part size is represented with part size PRTSIZE (4 bytes) of the part information PRTINF. The first two bytes of the part size PRTSIZE represents the number of total clusters of the current part. The next two bytes represent the positions of the start sound unit (SU) and the end sound unit (SU) of the beginning and last clusters, respectively. Hereinafter, a sound unit is abbreviated as SU. With such a part notation, when music data is edited, the movement of the music data can be suppressed. When music data is edited for each block, although the movement thereof can be suppressed, the edit unit of a block is much larger than the edit unit of a SU.

SU is the minimum unit of a part. In addition, SU is the minimum data unit in the case that audio data is compressed corresponding to the ATRAC3 format. 1 SU is audio data of which data of 1024 samples at 44.1 kHz (1024×16 bits×2 channels) is compressed to data that is around 10 times smaller than that of original data. The duration of 1 SU is around 23 msec. Normally, one part is composed of several thousand SU. When one cluster is composed of 42 SU, one cluster allows a sound of one second to be generated. The number of parts composing one track depends on the size of the additional information. Since the number of parts is obtained by subtracting the header, the program name, the additional data, and so forth from one block, when there is no additional information, the maximum number of parts (645 parts) can be used.

Figure 10A:
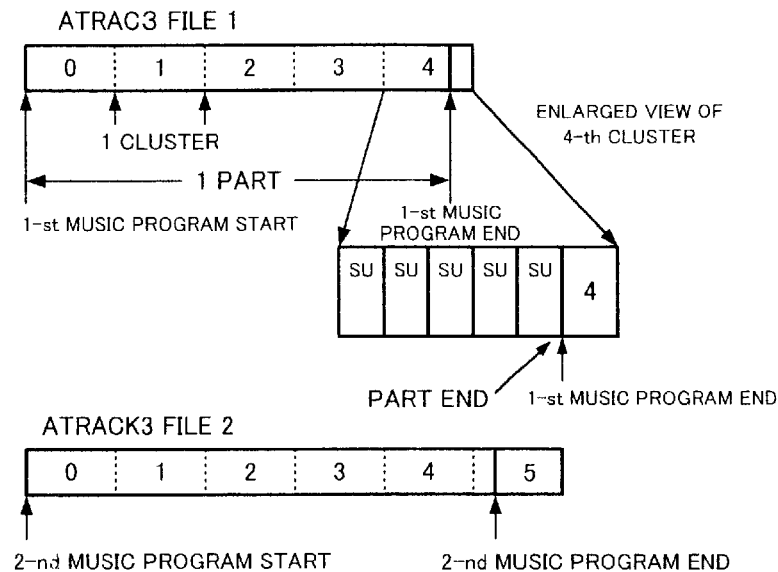
FIG. 10A is a schematic diagram showing the file structure before two files are edited with a combining process.

FIG. 10A is a schematic diagram showing the file structure in the case that two music programs of a CD or the like are successively recorded. The first program (file 1) is composed of for example five clusters. Since one cluster cannot contain two files of the first program and the second program, the file 2 starts from the beginning of the next cluster. Thus, the end of the part 1 corresponding to the file 1 is in the middle of one cluster and the remaining area of the cluster contains no data. Likewise, the second music program (file 2) is composed of one part. In the case of the file 1, the part size is 5. The first cluster starts at 0-th SU. The last cluster ends at 4-th SU.

There are four types of edit processes that are a divide process, a combine process, an erase process, and a move process. The divide process is performed to divide one track into two portions. When the divide process is performed, the number of total tracks increases by one. In the divide process, one file is divided into two files on the file system. Thus, in this case, the reproduction management file and the FAT are updated. The combine process is performed to combine two tracks into one track. When the combine process is performed, the number of total tracks decreases by one. In the combine process, two files are combined into one file on the file system. Thus, when the combine process is performed, the reproduction management file and the FAT are updated. The erase process is performed to erase a track. The track numbers after the track that has been erased decrease one by one. The move process is performed to change the track sequence. Thus, when the erase process or the move process is performed, the reproduction management file and the FAT are updated.

Figure 10B:
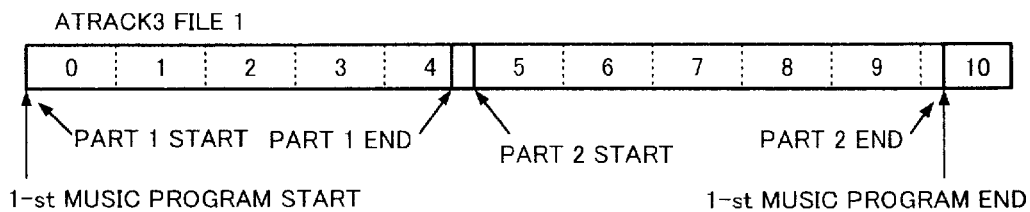
FIG. 10B is a schematic diagram showing the file structure after two files are edited with a combining process.
Figure 10C:
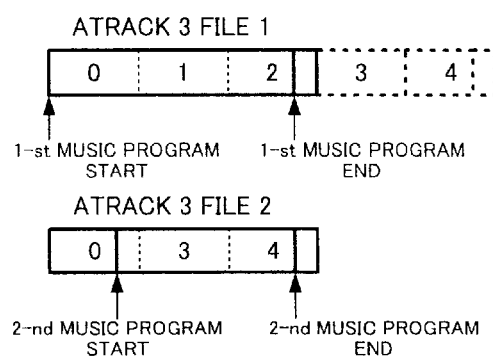
FIG. 10C is a schematic diagram showing the file structure after one file is edited with a dividing process.

FIG. 10B is a schematic diagram showing the combined result of two programs (file 1 and file 2) shown in FIG. 10A. As a result of the combine process, the combined file is composed of two parts. FIG. 10C is a schematic diagram showing the divided result of which one program (file 1) is divided in the middle of the cluster 2. By the divide process, the file 1 is composed of clusters 0, 1, and the beginning portion of cluster 2. The file 2 is composed of the end portion of cluster 2 and clusters 3 and 4.

As described above, according to the embodiment of the present invention, since the part notation is defined, as the combined result (see FIG. 10B), the start position of the part 1, the end position of the part 1, and the end portion of the part 2 can be defined with SU. Thus, to pack the space due to the combined result, it is not necessary to move the music data of the part 2. In addition, as the divided result (see FIG. 10C), it is not necessary to move data and pack the space at the beginning of the file 2.

FIG. 11 is a schematic diagram showing the detailed data structure of the reproduction management file PBLIST. FIGS. 12A and 12B show a header portion and the remaining portion of the reproduction management file PBLIST. The size of the reproduction management file is one cluster (one block=16 KB). The size of the header shown in FIG. 12A is 32 bytes. The rest of the reproduction management file PBLIST shown in FIG. 12B contains a name NM1-S area (256 bytes) (for the memory card), a name NM2-S area (512 bytes), a contents key area, a MAC area, an S-YMDhms area, a reproduction sequence management table TRKTBL area (800 bytes), a memory card additional information INF-S area (14720 bytes), and a header information redundant area. The start positions of these areas are defined in the reproduction management file.

The first 32 bytes of (0x0000) to (0x0010) shown in FIG. 12A are used for the header. In the file, 16-byte areas are referred to as slots. Referring to FIG. 12A, the header are placed in the first and second slots. The header contains the following areas. An area denoted by "Reserved" is an undefined area. Normally, in a reserved area, a null (0x00) is written. However, even if any data is written to a reserved area, the data written in the reserved is ignored. In a future version, some reserved areas may be used. In addition, data is prohibited from being written to a reserved area. When an option area is not used, it is treated as a reserved area.

= BLKID-TL0 (4 bytes)
  Meaning: BLOCKID FILE ID
  Function: Identifies the top of the
reproduction management file.
  Value: Fixed value = "TL = 0" (for example,
0x544C2D30)
= MCode (2 bytes)
  Meaning: MAKER CODE
  Function: Identifies the maker and model of
the recorder/player
  Value: High-order 10 bits (Maker code); low-
order 6 bits (model code).
= REVISION (4 bytes)
  Meaning: Number of rewrite times of PBLIST
  Function: Increments whenever the
reproduction management file is rewritten.
  Value: Starts at 0 and increments by 1.
= S-YMDhms (4 bytes) (Option)
  Meaning: Year, month, day, hour, minute, and
second recorded by the recorder/player with a reliable
clock.
  Function: Identifies the last recorded date
and time.
  Value: bits 25 to 31: Year 0 to 99 (1980 to 2079)
    bits 21 to 24: Month 0 to 12
    bits 16 to 20: Day 0 to 31
    bits 11 to 15: Hour 0 to 23
    bits 05 to 10: Minute 0 to 59
    bits 00 to 04: Second 0 to 29 (two bit
interval)
= SY1C+L (2 bytes)
  Meaning: Attribute of name (one byte code)
of memory card written in NM1-S area.
  Function: Represents the character code and
the language code as one byte code.
  Value: Character code (C): High-order one
byte
    00: Non-character code, binary number
    01: ASCII (American Standard Code for
    Information Interchange)
    02: ASCII+KANA
    03: Modified 8859-1
    81: MS-JIS
    82: KS C 5601-1989
    83: GB (Great Britain) 2312-80
    90: S-JIS (Japanese Industrial
Standards) (for        Voice)
      Language code (L): Low-order one
byte
    Identifies the language based on EBU
Tech 3258
    standard.
    00: Not set
    08: German
    09: English
    0A: Spanish
    0F: French 15: Italian
1D: Dutch
65: Korean
69: Japanese
75: Chinese
When data is not recorded, this area is all 0.
= SN2C+L (2 bytes)
Meaning: Attribute of name of memory card in NM2-S area.
Function: Represents the character code and the language coded as one byte code.
Value: Same as SN1C+L
= SINFSIZE (2 bytes)
Meaning: Total size of additional information of memory card in INF-S area.
Function: Represents the data size as an increment of 16 bytes. When data is not recorded, this area is all 0.
Value: Size: 0x0001 to 0x39C (924)
= T-TRK (2 bytes)
Meaning: TOTAL TRACK NUMBER
Function: Represents the number of total tracks.
Value: 1 to 0x0190 (Max. 400 tracks)
When data is recorded, this area is all 0.
= VerNo (2 bytes)
Meaning: Format version number
Function: Represents the major version number (high order one byte) and the minor version number (low order one byte).
Value: 0x0100 (Ver 1.0)
0x0203 (Ver 2.3)
Next, areas (see FIG. 13B) that preceded by the header will be described.
= NM1-S
Meaning: Name of memory card (as one byte code)
Function: Represents the name of the memory card as one byte code (max. 256). At the end of this area, an end code (0x00) is written. The size is calculated from the end code. When data is not recorded, null (0x00) is recorded from the beginning (0x0020) of this area for at least one byte.
Value: Various character code
= NM2-S
Meaning: Name of memory card (as two byte code)
Function: Represents the name of the memory card as two byte code (max. 512). At the end of this area, an end code (0x00) is written. The size is calculated from the end code. When data is not recorded, null (0x00) is recorded from the beginning (0x0120) of this area for at least two bytes.
Value: Various character code
= CONTENTS KEY
Meaning: Value for music program. Protected with MG(M) and stored. Same as CONTENTS KEY.
Function: Used as a key necessary for calculating MAC of S-YMDhms.
Value: 0 to 0xFFFFFFFFFFFFFFFF
= MAC
Meaning: Forged copyright information check value
Function: Represents the value generated with S-YMDhms and CONTENTS KEY.
Value: 0 to 0xFFFFFFFFFFFFFFFF
= TRK-nnn
Meaning: SQN (sequence) number of ATRAC3 data file reproduced.
Function: Represents FNo of TRKINF.
Value: 1 to 400 (0x190)
When there is no track, this area is all 0.
= INF-S
Meaning: Additional information of memory card (for example, information with respect to photos, songs, guides, etc.)
Function: Represents variable length additional information with a header. A plurality of types of additional information may be used. Each of the types of additional information has an ID and a data size. Each additional information area including a header is composed of at least 16 bytes and a multiple of 4 bytes. For details, see the following section.
Value: Refer to the section of "Data Structure of Additional Information".
= S-YMDhms (4 bytes) (Option)
Meaning: Year, month, day, hour, minute, and second recorded by the recorder/player with a reliable clock.
Function: Identifies the last recorded date and time. In this case of EMD, this area is mandatory.
Value: bits 25 to 31: Year 0 to 99 (1980 to 2079)
bits 21 to 24: Month 0 to 12
bits 16 to 24: Day 0 to 31
bits 11 to 15: Hour 0 to 23
bits 05 to 10: Minute 0 to 59
bits 00 to 04: Second 0 to 29 (two second interval)

As the last slot of the reproduction management file, the same BLKID-TL0, MCode, and REVISION as those in the header are written.

While data is being recorded to a memory card, it may be mistakenly or accidentally detached or the power of the recorder/player may be turned off. When such an improper operation is performed, a defect should be detected. As described above, the REVISION area is placed at the beginning and end of each block. Whenever data is rewritten, the value of the REVISION area is incremented. If a defect termination takes place in the middle of a block, the value of the REVISION area at the beginning of the block does not match the value of the REVISION area at the end of the block. Thus, such a defect termination can be detected. Since there are two REVISION areas, the abnormal termination can be detected with a high probability. When an abnormal termination is detected, an alarm such as an error message is generated.

In addition, since the fixed value BLKID-TL0 is written at the beginning of one block (16 KB), when the FAT is destroyed, the fixed value is used as a reference for recovering data. In other words, with reference to the fixed value, the type of the file can be determined. Since the fixed value BLKID-TL0 is redundantly written at the header and the end portion of each block, the reliability can be secured. Alternatively, the same reproduction management file can be redundantly recorded.

The data amount of an ATRAC3 data file is much larger than that of the track information management file. In addition, as will be described later, a block number BLOCK SERIAL is added to ATRAC3 data file. However, since a plurality of ATRAC3 files are recorded to the memory card, to prevent them from become redundant, both CONNUM0 and BLOCK SERIAL are used. Otherwise, when the FAT is destroyed, it will be difficult to recover the file. In other words, one ATRAC3 data file may be composed of a plurality of blocks that are dispersed. To identify blocks of the same file, CONNUM0 is used. In addition, to identify the order of blocks in the ATRAC3 data file, BLOCK SERIAL is used.

Likewise, the maker code (Mcode) is redundantly recorded at the beginning and the end of each block so as to identify the maker and the model in such a case that a file has been improperly recorded in the state that the FAT has not been destroyed.

FIG. 12C is a schematic diagram showing the structure of the additional information data. The additional information is composed of the following header and variable length data. The header has the following areas.

```
= INF
    Meaning: FIELD ID
    Function: Represents the beginning of the
additional information (fixed value).
    Value: 0x69
= ID
    Meaning: Additional information key code
    Function: Represents the category of the
additional information.
    Value: 0 to 0xFF
= SIZE
    Meaning: Size of individual additional
information
    Function: Represents the size of each type
of additional information. Although the data size is
not limited, it should be at least 16 bytes and a
multiple of 4 bytes. The rest of the data should be
filled with null (0x00).
    Value: 16 to 14784 (0x39C0)
= MCode
    Meaning: MAKER CODE
    Function: Identifies the maker and model of
the recorder/player.
    Value: High-order 10 bits (maker code), low-
order 10 bits (machine code).
= C+L
    Meaning: Attribute of characters in data
area starting from byte 12.
    Function: Represents the character code and
the language code as one byte code.
    Value: Same as SNC+L
= DATA
    Meaning: Individual additional information
    Function: Represents each type of additional
information with variable length data. Real data
always starts from byte 12. The length (size) of the
real data should be at least 4 bytes and a multiple of
4 bytes. The rest of the data area should be filled
with null (0x00).
    Value: Individually defined corresponding to
the contents of each type of additional information.
```

FIG. 13 is a table that correlates key code values (0 to 63) of additional information and types thereof. Key code values (0 to 31) are assigned to music character information. Key code values (32 to 63) are assigned to URLs (Uniform Resource Locator) (web information). The music character information and URL information contain character information of the album title, the artist name, the CM, and so forth as additional information.

FIG. 14 is a table that correlates key code values (64 to 127) of additional information and types thereof. Key code values (64 to 95) are assigned to paths/others. Key code values (96 to 127) are assigned to control/numeric data. For example, ID=98 represents TOC-ID as additional information. TOC-ID represents the first music program number, the last music program number, the current program number, the total performance duration, and the current music program duration corresponding to the TOC information of a CD (Compact Disc).

FIG. 15 is a table that correlates key code values (128 to 159) of additional information and types thereof. Key code values (128 to 159) are assigned to synchronous reproduction information. In FIG. 15, EMD stands for electronic music distribution.

Figure 16A:
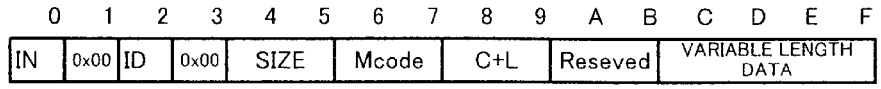
FIG. 16A is a schematic diagram showing the data structure of additional information data.
Figure 16B:
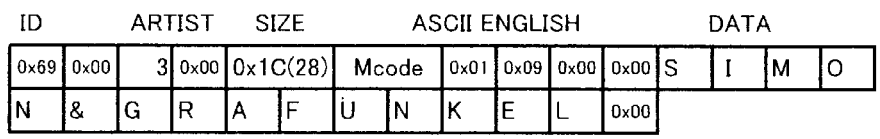
FIG. 16B is a schematic diagram showing the data structure in the case that additional information data is an artist name.

Next, with reference to FIGS. 16A to 16E, real examples of additional information will be described. As with FIG. 12C, FIG. 16A shows the data structure of the additional information. In FIG. 16B, key code ID=3 (artist name as additional information). SIZE=0x1C (28 bytes) representing that the data length of additional information including the header is 28 bytes; C+L representing that character code C=0x01 (ASCII) and language code L=0x09 (English). Variable length data after byte 12 represents one byte data "SIMON & GRAFUNKEL" as artist name. Since the data length of the additional information should be a multiple of 4 bytes, the rest is filled with (0x00).

Figure 16C:
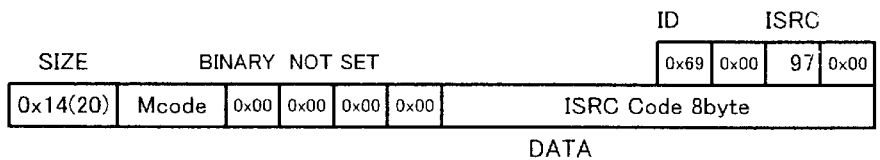
FIG. 16C is a schematic diagram showing the data structure in the case that additional information data is a copyright code.

In FIG. 16C, key code ID=97 representing that ISRC (International Standard Recording Code: Copyright code) as additional information. SIZE=0x14 (20 bytes) representing that the data length of the additional information is 20 bytes. C=0x00 and L=0x00 representing that characters and language have not been set. Thus, the data is binary code. The variable length data is eight-byte ISRC code representing copyright information (nation, copyright owner, recorded year, and serial number).

Figure 16D:
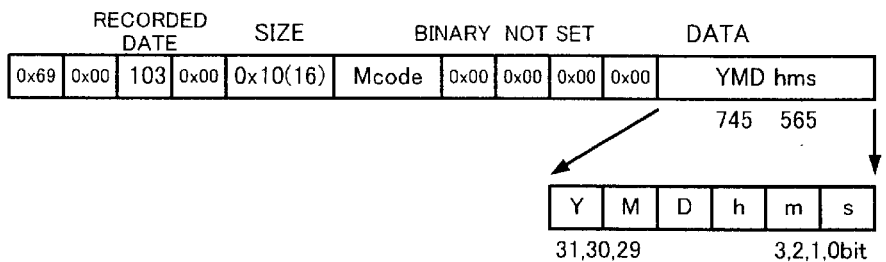
FIG. 16D is a schematic diagram showing the data structure in the case that additional information data is date/time information.

In FIG. 16D, key code ID=is 97 representing recorded date and time as additional information. SIZE=0x10 (16 bytes) representing that the data length of the additional information is 16 bytes. C=0x00 and L=representing that characters and language have not been set. The variable length data is four-byte code (32 bit) representing the recorded date and time (year, month, day, hour, minute, second).

Figure 16E:
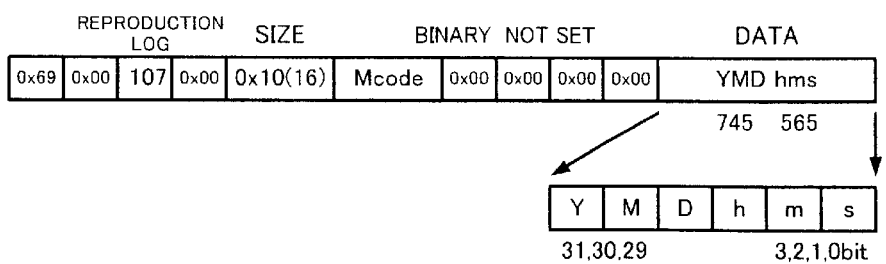
FIG. 16E is a schematic diagram showing the data structure in the case that additional information data is a reproduction log.

In FIG. 16E, key code ID=107 representing a reproduction log as additional information. SIZE=0x10 (16 bytes) representing that the data length of the additional information is 16 bytes. C=0x00 and L=0x00 representing that characters and language have not been set. The variable length data is a four-byte code representing a reproduction log (year, month, day, hour, minute, second). When the recorder/player has a reproduction log function, it records data of 16 bytes whenever it reproduces music data.

FIG. 17 is a schematic diagram showing a data arrangement of ATRAC3 data file A3Dnnnn in the case that 1 SU is N bytes (for example, N=384 bytes). FIG. 17 shows an attribute header (1 block) of a data file and a music data file (1 block). FIG. 17 shows the first byte (0x0000 to 0x7FF0) of each slot of the two blocks (16×2=32 kbytes). As shown in FIG. 18, the first 32 bytes of the attribute header are used as a header; 256 bytes are used as a music program area NM1 (256 bytes); and 512 bytes are used as a music program title area NM2 (512 bytes). The header of the attribute header contains the following areas.

```
= BLKID-HD0 (4 bytes)
    Meaning: BLOCKID FIELD ID
    Function: Identifies the top of an ATRA3
data file.
    Value: Fixed value = "HD = 0" (For example,
0x48442D30)
= MCode (2 bytes)
    Meaning: MAKER CODE
    Function: Identifies the maker and model of
the recorder/player
    Value: High-order 10 bits (maker code); low-
order 6 bits (machine code)
= BLOCK SERIAL (4 bytes)
    Meaning: Track serial number
    Function: Starets from 0 and increments by
1. Even if a music program is edited, this value does
not vary.
    Value: 0 to 0xFFFFFFFF.
= N1C+L (2 bytes)
    Meaning: Represents the attribute of data
```

-continued (NM1) of a track (music program title).
Function: Represent the character code and language code of NM1 as one byte code.
Value: Same as SN1C+L
= N2C+L (2 bytes)
Meaning: Represents the attribute of data (NM2) of a track (music program title).
Function: Represent the character code and language code of NM1 as one byte code.
Value: Same as SN1C+L
= INFSIZE (2 bytes)
Meaning: Total size of additional information of current track.
Function: Represents the data size as a multiple of 16 bytes. When data is not recorded, this area should be all 0.
Value: 0x0000 to 0x3C6 (966)
= T-PRT (2 bytes)
Meaning: Number of total bytes
Function: Represents the number of parts that composes the current track. Normally, the value of T-PRT is 1.
Value: 1 to 285 (645 dec).
= T-SU (4 bytes)
Meaning: Number of total SU.
Function: Represents the total number of SU in one track that is equivalent to the program performance duration.
Value: 0x01 to 0x001FFFFF
= INX (2 bytes) (Option)
Meaning: Relative position of INDEX
Function: Used as a pointer that represents the top of a representative portion of a music program. The value of INX is designated with a value of which the number of SU is divided by 4 as the current position of the program. This value of INX is equivalent to 4 times larger than the number of SU (around 93 msec).
Value: 0 to 0xFFFF (max, around 6084 sec)
= XT (2 bytes) (Option)
Meaning: Reproduction duration of INDEX
Function: Designates the reproduction duration designated by INX-nnn with a value of which the number of SU is divided by 4. The value of INDEX is equivalent to four times larger than the normal SU (around 93 msec).
Value: 0x0000 (no setting); 0x01 to 0xFFFE (up to 6084 sec); 0xFFFF (up to end of music program)
Next, the music program title areas NM1 and NM2 will be described.
= NM1
Means: Character string of music program title
Function: Represents a music program title as one byte code (up to 256 characters) (variable length). The title area should be completed with an end code (0x00). The size should be calculated from the end code. When data is not recorded, null (0x00) should be recorded from the beginning (0x0020) of the area for at least one byte.
Value: Various character codes
= NM2
Means: Character string of music program title
Function: Represents a music program title as two byte code (up to 512 characters) (variable length). The title area should be completed with an end code (0x00). The size should be calculated from the end code. When data is not recorded, null (0x100) should be recorded from the beginning (0x0120) of the area for at least two bytes.
Value: Various character codes
Data of 80 bytes starting from the fixed position (0x320) of the attribute header is referred to as track information area TRKINF. This area is mainly used to totally manage the security information and copy control information. FIG. 19 shows a part of TRKINF. The area TRKINF contains the following areas.
= CONTENTS KEY (8 bytes)
Meaning: Value for each music program. The value of CONTENTS KEY is protected in the security block of the memory card and then stored.
Function: Used as a key for reproducing a music program. It is used to calculate the value of MAC.
Value: 0 to 0xFFFFFFFFFFFFFFFF
= MAC (8 bytes)
Meaning: Forged copyright information check value Function: Represents the value generated with a plurality of values of TRKINF including contents cumulation numbers and a secret sequence number.
The secret sequence number is a sequence number recorded in the secret area of the memory card. A non-copyright protection type recorder cannot read data from the secret area of the memory card. On the other hand, a copyright protection type recorder and a computer that operates with a program that can read data from a memory card can access the secret area.
= A (1 byte)
Meaning: Attribute of part.
Function: Represents the information of such as compression mode of a part.
Value: The details will be described in the following (see FIGS. 19 and 20).

Next, the value of the area A will be described. In the following description, monaural mode (N=0 or 1) is defined as a special joint mode of which bit 7=1, sub signal=0, main signal=(L+R). A non-copyright protection type player may ignore information of bits 2 and 1.

Bit 0 of the area A represents information of emphasis on/off state. Bit 1 of the area A represents information of reproduction skip or normal reproduction. Bit 2 of the area A represents information of data type such as audio data, FAX data, or the like. Bit 3 of the area A is undefined. By a combination of bits 4, 5, and 6, mode information of ATRAC3 is defined as shown in FIG. 20. In other words, N is a mode value of 3 bits. For five types of modes that are monaural (N=0 or 1), LP (N=2), SP (N=4), EX (N=5), and HQ (N=7), record duration (64 MB memory card only), data transmission rate, and the number of SU per block are listed. The number of bytes of 1 SU depends on each mode. The number of bytes of 1 SU in the monaural mode is 136 bytes. The number of bytes of 1 SU in the LP mode is 192 bytes. The number of bytes of 1 SU in the SP mode is 304 bytes. The number of bytes of 1 SU in the EX mode is 384 bytes. The number of bytes of 1 SU in the HQ mode is 512bytes. Bit 7 of the area A represents ATRAC3 modes (0: Dual, 1: JOint).

For example, an example of which a 64 MB memory card is used in the SP mode will be described. A 64-MB memory card has 3968 blocks. In the SP mode, since 1 SU is 304 bytes, one block has 53 SU. 1 SU is equivalent to (1024/44100) seconds. Thus, one block is (1024/44100)×53× (3968−10)=4863 seconds=81 minutes. The transmission rate is (44100/1024)×304×8=104737 bps.

= LT (one byte)
Meaning: Reproduction restriction flag (bits 7 and 6) and security partition (bits 5 to 0).
Function: Represents a restriction of the current track.
Value: bit 7: 0 = no restriction, 1 = restriction
bit 6: 0 = not expired, 1 = expired
bits 5 to 0: security partition -continued (reproduction
   prohibited other than 0)
= FNo (2 bytes)
   Meaning: File number.
   Function: Represents the initially recorded
track number that designates the position of the MAC
calculation value recorded in the secret area of the
memory card.
   Value: 1 to 0×190 (400)
= MG(D) SERIAL-nnn (16 bytes)
   Meaning: Represents the serial number of the
security block (security IC 20) of the recorder/player.
   Function: Unique value for each
recorder/player
   Value: 0 to
0×FFFFFFFFFFFFFFFFFFFFFFFFFFFFFFFF
= CONNUM (4 bytes)
   Meaning: Contents cumulation number
   Function: Represents a unique value
cumulated for each music program. The value is managed
by the security block of the recorder/player. The
upper limit of the value is $2^{32}$ that is 4,200,000,000.
Used to identify a recorded program.
   Value: 0 to 0×FFFFFFFF
   YMDhms-S (4 bytes) (Option)
   Meaning: Reproduction start date and time of
track with reproduction restriction
   Function: Represents the date and time at
which data reproduction is permitted with EMD.
   Value: Same as the notation of date and time
of other areas
= YMDhms-E (4 bytes) (Option)
   Meaning: Reproduction end date and time of
track with reproduction restriction
   Function: Represents the date and time at
which data reproduction is expired with EMD.
   Value: Same as the notation of date and time
of other areas
= MT (1 byte) (Option)
   Meaning: Maximum value of number of permitted
reproduction times
   Function: Represents the maximum number of
reproduction times designated by EMD.
   Value: 1 to 0×FF. When not used, the value
of the area MT is 00.
= CT (1 byte) (Option)
   Meaning: Number of reproduction times
   Function: Represents the number of
reproduction times in the number of permitted
reproduction times. Whenever data is reproduced, the
value of the area CT is decremented.
   Value: 0×00 to 0×FF. When not used, the
value of the area CT is 0×00. When bit 7 of the area
LT is 1 and the value of the area CT is 00, data is
prohibited from being reproduced.
= CC (1 byte)
   Meaning: COPY CONTROL
   Function: Controls the copy operation.
   Value: bits 6 and 7 represent copy control
information. bits 4 and 5 represent copy control
information of a high speed digital copy operation.
bits 2 and 3 represent a security block authentication
level. bits 0 and 1 are undefined.
   Example of CC:
      (bits 7 and 6)
      11: Unlimited copy operation permitted
      01: copy prohibited
      00: one time copy operation permitted
      (bits 3 and 2)
      00: analog/digital input recording
         MG authentication level is 0.
   When digital record operation using data from
a CD is performed, (bits 7 and 6): 00 and (bits 3 and
2): 00.
= CN (1 byte) (Option)
   Meaning: Number of permitted copy times in
high speed serial copy management system
   Function: Extends the copy permission with
the number of copy times, not limited to one time copy -continued permission and copy free permission. Valid only in
first copy generation. The value of the area CN is
decremented whenever the copy operation is performed.
   Value"
      00: Copy prohibited
      01 to 0×FE: Number of times
      0×FF: Unlimited copy times
   The track information area TRKINF is followed
by a 24-byte part management information area (PRTINF)
starting from 0×0370. When one track is composed of a
plurality of parts, the values of areas PRTINF of the
individual parts are successively arranged on the time
axis. FIG. 22 shows a part of the area PRTINF. Next,
areas in the area PRTINF will be described in the order
of the arrangement.
= PRTSIZE (4 bytes)
   Meaning: Part size
   Function: Represents the size of a part.
Cluster: 2 bytes (highest position), start SU: 1 byte
(upper), end SU: 1 byte (lowest position).
   Value: cluster: 1 to 0×1F40 (8000)
      start SU: 0 to 0×A0 (160)
      end SU: 0 to 0×A0 (16) (Note that SU
starts from 0.)
= PRTKEY (8 bytes)
   Meaning: Part encrypting value
   Function: Encrypts a part. Initial value =
0. Note that edit rules should be applied.
   Value: 0 to 0×FFFFFFFFFFFFFFFF
= CONNUM0 (4 bytes)
   Meaning: Initially generated contents
cumulation number key
   Function: Uniquely designates an ID of
contents.
   Value: Same value as the value of the
contents cumulation number initial value key
   As shown in FIG. 17, the attribute header of
an ATRAC3 data file contains additional information
INF. The additional information is the same as the
additional information INF-S (see FIGS. 11 and 12B) of
the reproduction management file except that the start
position is not fixed. The last byte position (a
multiple of four bytes) at the end of one or a
plurality of parts is followed by data of the
additional information INF.
= INF
   Meaning: Additional information with respect
to track
   Function: Represents variable length
additional information with a header. A plurality of
different types of additional information may be
arranged. Each of additional information areas has an
ID and a data size. Each additional information area
is composed of at least 16 bytes and a multiple of 4
bytes.
   Value: Same as additional information INF-S
of reproduction management file
   The above-described attribute header is
followed by data of each block of an ATRAC3 data file.
As shown in FIG. 23, a header is added for each block.
Next, data of each block will be described.
= BLKID-A3D (4 bytes)
   Meaning: BLOCKID FILE ID
   Function: Identifies the top of ATRAC3 data.
   Value: Fixed value = "A3D" (for example,
0×41334420)
= MCode (2 bytes)
   Meaning: MAKER CODE
   Function: Identifies the maker and model of
the recorder/player
   Value: High-order 10 bits (maker code); low-
order 6 bits (model code)
= CONNUM0 (4 bytes)
   Meaning: Cumulated number of initially
created contents
   Function: Designates a unique ID for
contents. Even if the contents are edited, the value
of the area CONNUM0 is not changed.
   Value: Same as the contents cumulation -continued

```
number initial key
    = BLOCK SERIAL (4 bytes)
    Meaning: Serial number assigned to each
track
    Function: Starts from 0 and increments by 1.
Even if the contents are edited, the value of the area
BLOCK SERIAL is not changed.
    Value: 0 to 0xFFFFFFFF
    = BLOCK-SEED (8 bytes)
    Meaning: Key for encrypting one block
    Function: The beginning of the block is a
random number generated by the security block of the
recorder/player. The random number is followed by a
value incremented by 1. When the value of the area
BLOCK-SEED is lost, since sound is not generated for
around one second equivalent to one block, the same
data is written to the header and the end of the block.
Even if the contents are edited, the value of the area
BLOCK-SEED is not changed.
    Value: Initially 8-bit random number
    = INITIALIZATION VECTOR (8 bytes)
    Meaning: Value necessary for
encrypting/decrypting ATRAC3 data
    Function: Represents an initial value
necessary for encrypting and decrypting ATRAC3 data for
each block. A block starts from 0. The next block
starts from the last encrypted 8-bit value at the last
SU. When a block is divided, the last eight bytes just
before the start SU is used. Even if the contents are
edited, the value of the area INITIALIZATION VECTOR is
not changed.
    Value: 0 to 0xFFFFFFFFFFFFFFFF
    = SU-nnn
    Meaning: Data of sound unit
    Function: Represents data compressed from
1024 samples. The number of bytes of output data
depends on the compression mode. Even if the contents
are edited, the value of the area SU-nnn is not
changed. For example, in the SP mode, N = 384 bytes.
    Value: Data value of ATRAC3
```

In FIG. 17, since N=384, 42 SU are written to one block. The first two slots (4 bytes) of one block are used as a header. In the last slot (two bytes), the areas BLKID-A3D, MCode, CONNUM0, and BLOCK SERIAL are redundantly written. Thus, M bytes of the remaining area of one block is (16,384−384×42−16×3=208) bytes. As described above, the eight-byte area BLOCK SEED is redundantly recorded.

Figure 24B:
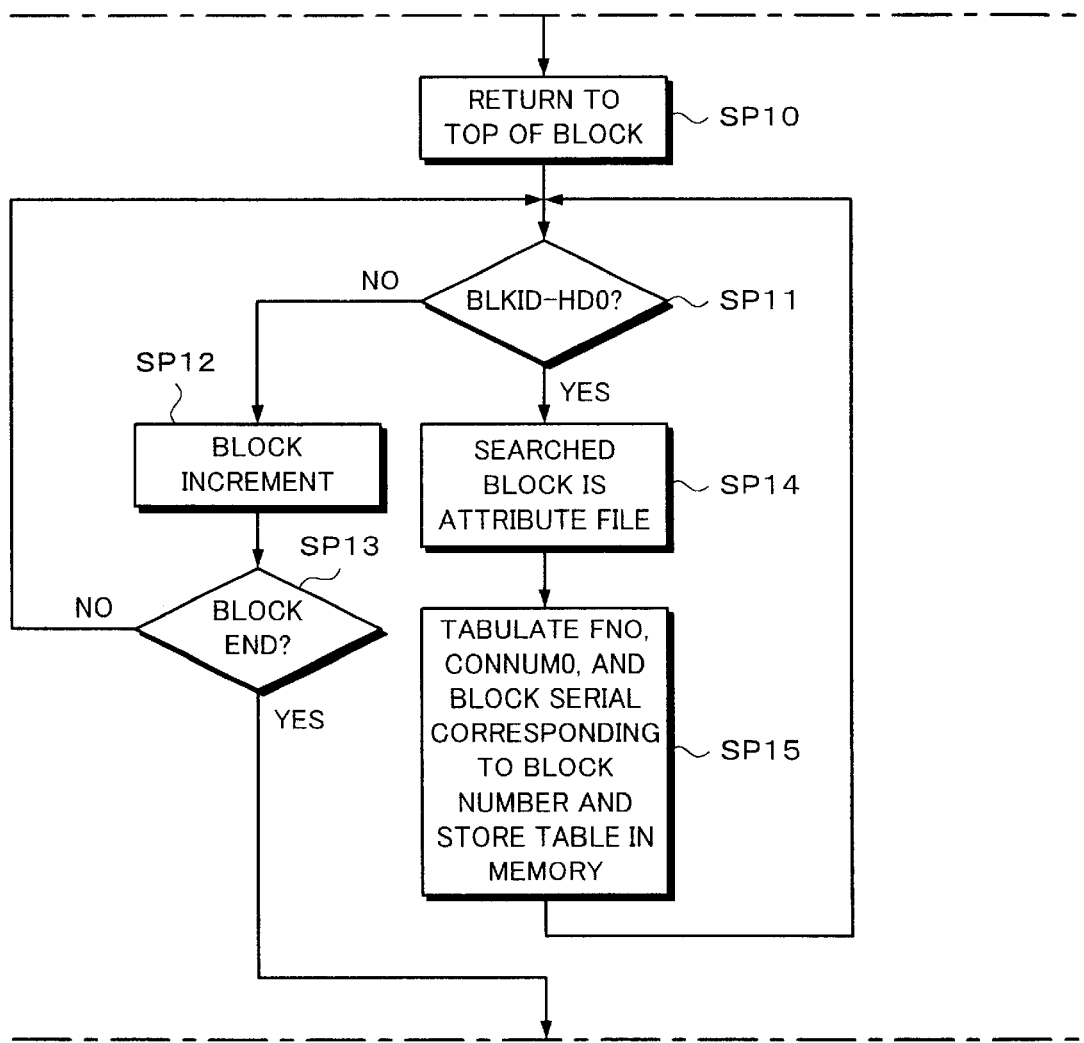
FIG. 24 is a flow chart showing a recovering method according to the present invention in the case that an FTA area was destroyed.
Figure 24C:
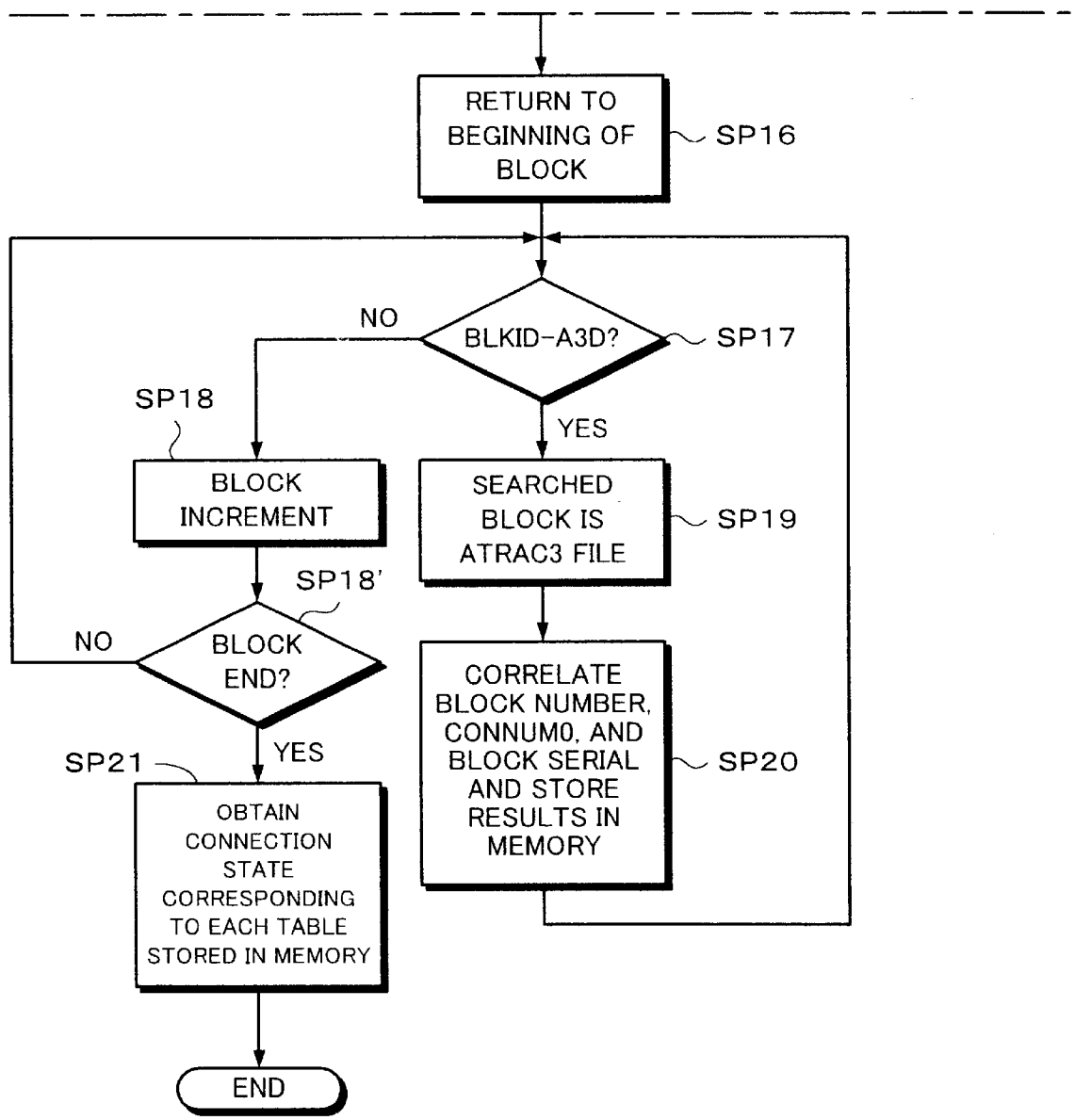

When the FAT area is destroyed, all blocks of the flash memory are searched. It is determined whether the value of the area ID BLKID at the beginning of each block is TL0, HD0, or A3D. As shown in FIGS. 24A to 24C, at step SP1, it is determined whether or not the value of the area ID BLKID at the beginning of the top block is BLKID-TL0. When the determined result at step SP1 is No, the flow advances to step SP2. At step SP2, the block number is incremented. Thereafter, at step SP3, it is determined whether or not the last block has been searched.

When the determined result at step SP3 is No, the flow returns to step SP1.

When the determined result at step SP1 is Yes, the flow advances to step SP4. At step SP4, it is determined that the searched block is the reproduction management file PBLIST. Thereafter, the flow advances to step SP5. At step SP5, the number of total tracks T-TRK in the reproduction management file PBLIST is stored as N to the register. For example, when the memory has stored 10 ATRAC3 data files (10 music programs), 10 has been stored in T-TRK.

Next, with reference to the value of the number of total tracks T-TRK, TRK-001 to TRK-400 of blocks are successively referenced. In this example, since 10 music programs have been recorded, TRK-001 to TRK-010 of blocks are referenced. Since a file number FNO has been recorded in TRK-XXX (where X=1 to 400) at step SP7, a table that correlates the track number TRK-XXX and the file number FNO is stored to the memory. Next, at step SP8, N stored in the register is decremented. A loop of steps SP6, SP7, and SP8 is repeated until N becomes 0 at step SP9.

When the determined result at step SP9 is Yes, the flow advances to step SP10. At step SP10, the pointer is reset to the top block. The searching process is repeated from the top block. Thereafter, the flow advances to step SP11. At step SP11, it is determined whether or not the value of the area ID BLKID of the top block is BLKID-HD0. When the determined result at step SP11 is No, the flow advances to step SP12. At step SP12, the block number is incremented. At step SP13, it is determined whether or not the last block has been searched.

When the determined result at step SP13 is No, the flow returns to step SP11. The searching process is repeated until the determined result at step SP11 becomes Yes.

When the determined result at step SP11 is Yes, the flow advances to step SP14. At step SP14, it is determined that the block is the attribute header (see FIG. 8) (0x0000 to 0x03FFF shown in FIG. 18) at the beginning of the ATRAC3 data file.

Next, at step SP15, with reference to the file number FNO, the sequence number BLOCK SERIAL of the same ATRAC data file, and the contents cumulation number key CON-NUM0 contained in the attribute header, they are stored to the memory. When 10 ATRAC3 data files have been recorded, since there are 10 blocks of which the value of the area ID BLKID of the top block is BLKID-TL0, the searching process is continued until 10 blocks are searched.

When the determined result at step SP13 is Yes, the flow advances to step SP16. At step SP16, the pointer is reset to the top block. The searching process is repeated from the top block.

Thereafter, the flow advances to step SP17. At step SP17, it is determined whether or not the value of the area ID BLKID of the top block is BLKID-A3D.

When the determined result at step SP17 is No, the flow advances to step S.P.C.A. At step SP18, the block number is incremented. Thereafter, at step SP18', it is determined whether or not the last block has been searched. When the determined result at step SP18' is No, the flow returns to step SP17.

When the determined result at step SP17 is Yes, the flow advances to step SP19. At step SP19, it is determined that the block contains ATRAC3 data. Thereafter, the flow advances to step SP20. At step SP20, with reference to the serial number BLOCK SERIAL recorded in the ATRAC3 data block and the contents cumulation number key CONNUM0, they are stored to the memory.

In the same ATRAC3 data file, the common number is assigned as the contents cumulation number key CON-NUM0. In other words, when one ATRAC3 data file is composed of 10 blocks, a common number is assigned to all the values of the areas CONNUM0.

In addition, when one ATRAC3 data is composed of 10 blocks, serial numbers 1 to 0 are assigned to the values of the areas BLOCK SERIALs of the 10 blocks.

Corresponding to the values of the areas CONNUM0 and BLOCK SERIAL, it is determined whether the current block composes the same contents and the reproduction order of the current block in the same contents (namely, the connection sequence).

When 10 ATRAC3 data files (namely, 10 music programs) have been recorded and each of the ATRAC3 data files is composed of 10 blocks, there are 100 data blocks.

With reference to the values of the areas CONNUM0 and BLOCK SERIAL, the reproduction order of music programs of 100 data blocks and the connection order thereof can be obtained.

When the determined result at step SP19 is Yes, all the blocks have been searched for the reproduction management file, the ATRAC3 data file, and the attribute file. Thus, at step SP21, based on the values of the areas CONNUM0, BLOCK SERIAL, FNO, and TRK-X in the order of block numbers of the blocks stored in the memory, the file connection state is obtained.

After the connection state is obtained, the FAT may be generated in a free area of the memory.

Figure 25:
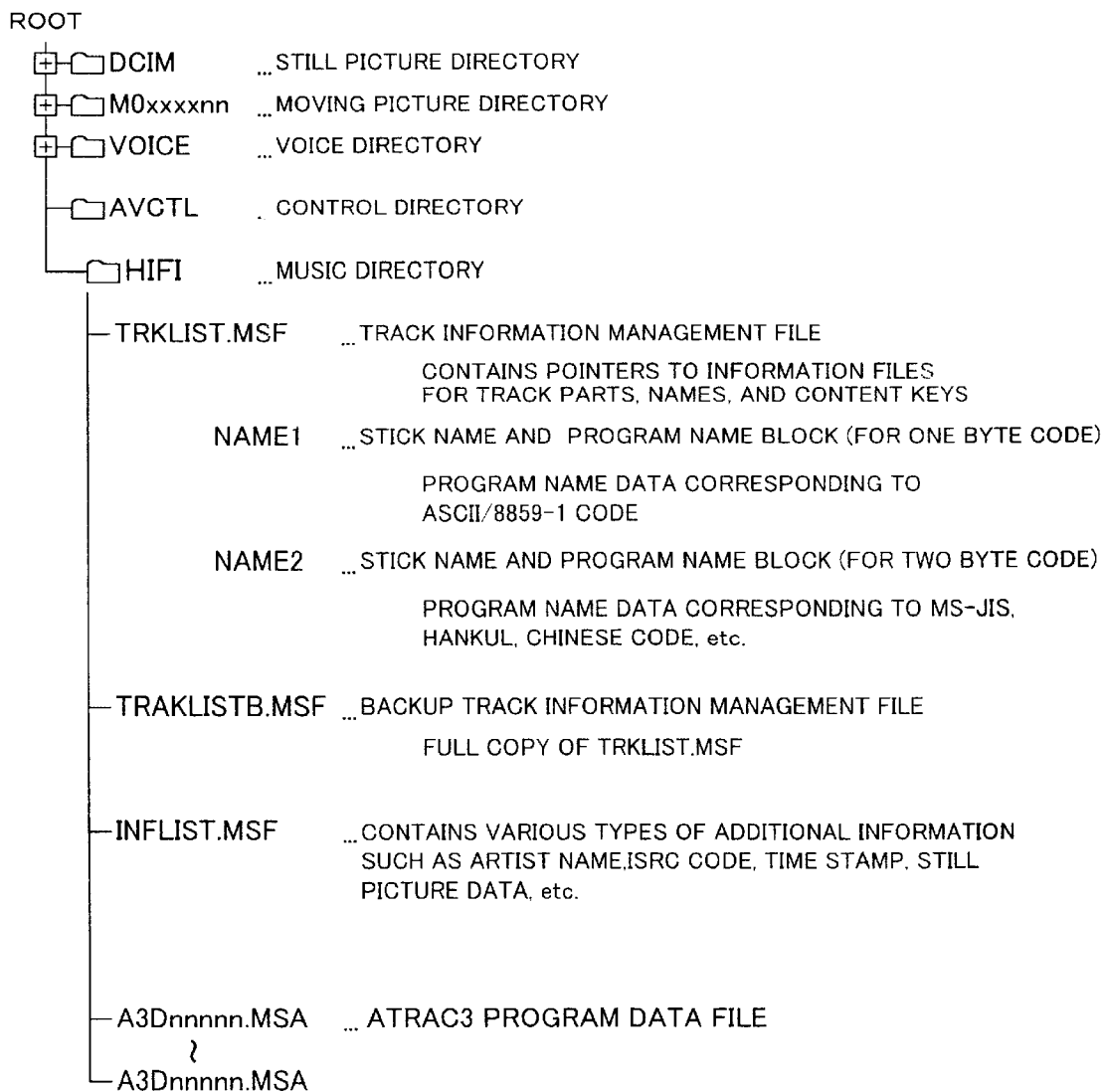
FIG. 25 is a schematic diagram showing the file structure in the memory card 40 according to a second embodiment of the present invention.

Next, a management file according to a second embodiment of the present invention will be described. FIG. 25 shows the file structure according to the second embodiment of the present invention. Referring to FIG. 25, a music directory contains a track information management file TRKLIST.MSF (hereinafter, referred to as TRKLIST), a backup track information management file TRKLISTB.MSF (hereinafter, referred to as TRKLISTB), an additional information file INFLIST.MSF (that contains an artist name, an ISRC code, a time stamp, a still picture data, and so forth (this file is referred to as INFIST)), an ATRAC3 data file A3Dnnnn.MSF (hereinafter, referred to as A3nnnn). The file TRKLIST contains two areas NAME1 and NAME2. The area NAME1 is an area that contains the memory card name and the program name (for one byte code corresponding to ASCII/8859-1 character code). The area NAME2 is an area that contains the memory card name and the program name (for two byte code corresponding to MS-JIS/Hankul/Chinese code).

Figure 26:
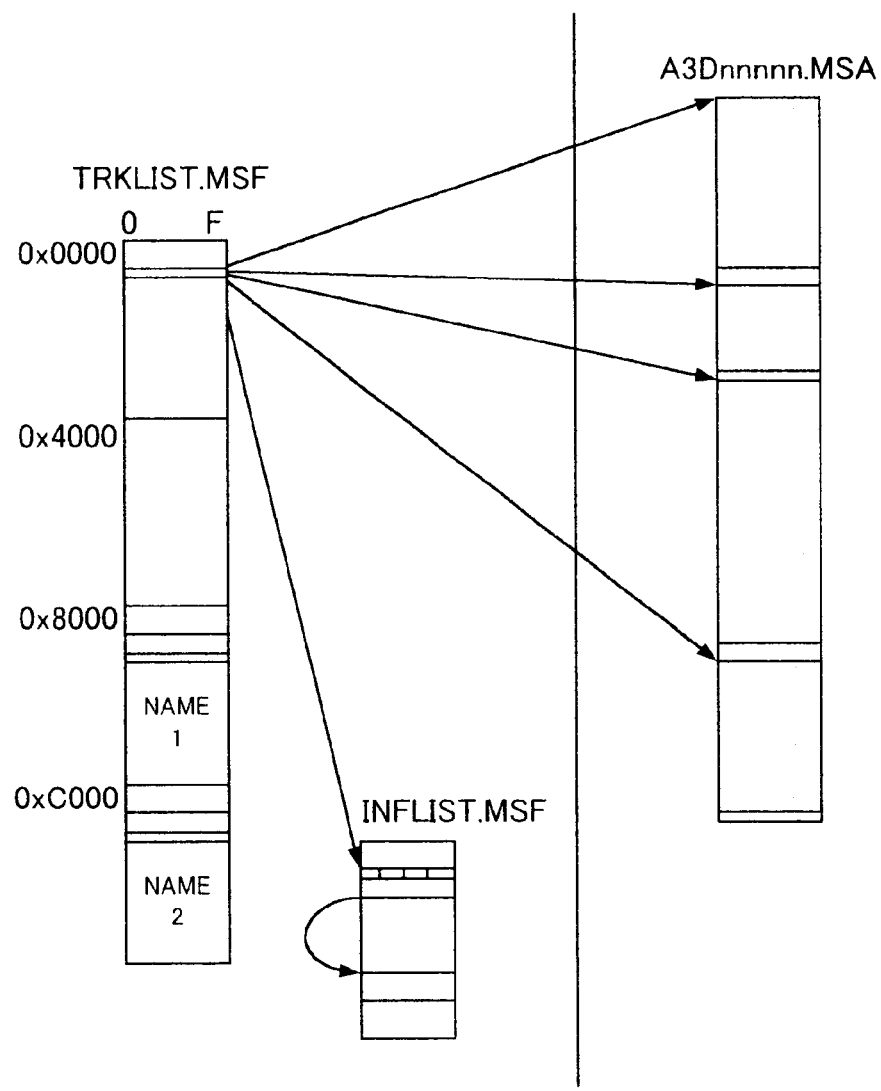
FIG. 26 is a schematic diagram showing the relation between a track information management file TRKLIST.MSF and an ATRAC3 data file A3Dnnnnn.MSA.

FIG. 26 shows the relation between the track information management file TRKLIST, the areas NAME1 and NAME2, and the ATRAC3 data file A3Dnnnn. The file TRKLIST is a fixed-length file of 64 kbytes (=16 k×4). An area of 32 kbytes of the file is used for managing tracks. The remaining area of 32 kbytes is used to contain the areas NAME1 and NAME2. Although the areas NAME1 and NAME2 for program names may be provided as a different file as the track information management file, in a system having a small storage capacity, it is convenient to totally manage the track information management file and program name files.

The track information area TRKINF-nnnn and part information area PRTINF-nnnn of the track information management file TRKLIST are used to manage the data file A3Dnnnn and the additional information INFLIST. Only the ATRAC3 data file A3Dnnnn is encrypted. In FIG. 26, the data length in the horizontal direction is 16 bytes (0 to F). A hexadecimal number in the vertical direction represents the value at the beginning of the current line.

According to the second embodiment, three files that are the track management file TRKLIST (including a program title file), the additional information management file INFLIST, and the data file A3Dnnnn are used. According to the first embodiment (see FIGS. 7, 8, and 9), two files that are the reproduction management file PBLIST for managing all the memory card and the data file ATRAC3 for storing programs are used.

Next, the data structure according to the second embodiment will be described. For simplicity, in the data structure according to the second embodiment, the description of similar portions to those of the first embodiment is omitted.

FIG. 27 shows the detailed structure of the track information management file TRKLIST. In the track information management file TRKLIST, one cluster (block) is composed of 16 kbytes. The size and data of the file TRKLISTB are the same as those of the backup file TRKLISTB. The first 32 bytes of the track information management file are used as a header. As with the header of the reproduction management file PBLIST, the header of the file TRKLIST contains a BLKID-TL0/TL1 (backup file ID) area (4 bytes), an area T-TRK (2 bytes) for the number of total tracks, a maker code area MCode (2 bytes), an area REVISION (4 bytes) for the number of TRKLIST rewrite times, and an area S-YMDhms (4 bytes) (option) for update date and time data. The meanings and functions of these data areas are the same as those of the first embodiment. In addition, the file TRKLIST contains the following areas.

= YMDhms (4 bytes)
Represents the last update date (year, month, day) of the file TRKLIST.
= N1 (1 byte) (Option)
Represents the sequential number of the memory card (numerator side). When one memory card is used, the value of the area N1 is 0×01.
= N2 (1 byte) (Option)
Represents the sequential number of the memory card (denominator side). When one memory card is used, the value of the area N2 is 0×01.
= MSID (2 bytes) (Option)
Represents the ID of a memory card. When a plurality of memory cards is used, the value of the area MSID of each memory card is the same (T.B.D.). (T.B.D. (to be defined) represents that this value may be defined in future).
= S-TRK (2 bytes).
Represents a special track (T.B.D.). Normally, the value of the area S-TRK is 0×0000.
= PASS (2 bytes) (Option)
Represents a password (T.B.D.).
= APP (2 bytes) (Option)
Represents the definition of a reproduction application (T.B.D.) (normally, the value of the area APP is 0×0000).
= INF-S (2 bytes) (Option)

Represents the additional information pointer of the entire memory card. When there is no additional information, the value of the area INF-S is 0×00.

The last 16 bytes of the file TRKLIST are used for an area BLKID-TL0, an area MCode, and an area REVISION that are the same as those of the header. The backup file TRKLISTB contains the above-described header. In this case, the header contains an area BLKID-TL1, an area MCode, and an area REVISION.

The header is followed by a track information area TRKINF for information with respect to each track and a part information area PRTINF for information with respect to each part of tracks (music programs). FIG. 27 shows the areas preceded by the area TRKLIST. The lower portion of the area TRKLISTB shows the detailed structure of these areas. In FIG. 27, a hatched area represents an unused area. The track information area TRKINF-nnn and the part information area PRTINF-nnn contain areas of an ATRAC3 data file. In other words, the track information area TRKINF-nnn and the part information area PRTINF-nnn each contain a reproduction restriction flag area LT (1 byte), a contents key area CONTENTS KEY (8 bytes), a recorder/player security block serial number area MG(D) SERIAL (16 bytes), an area XT (2 bytes) (option) for representing a feature portion of a music program, an area INX (2 bytes) (option), an area YMDhms-S (4 bytes) (option), an area YMDhms-E (4 bytes) (option), an area MT (1 byte) (option), an area CT (1 byte) (option), an area CC (1 byte) (option), an area CN (1 byte) (option) (these areas YMDhms-S, YMDhms-E, MT, CT, CC, and CN are used for reproduction restriction information and copy control information), an area A (1 byte) for part attribute, a part size area PRTSIZE (4 bytes), a part key area PRTKEY (8 bytes), and a contents cumulation number area CONNUM (4 bytes). The meanings, functions, and values of these areas are the same as those of the first embodiment. In addition, the track information area TRKINF-nnn and the part information area PRTINF-nnn each contain the following areas.

= T0 (1 byte)
 Fixed value (T0 = 0x74)
= INF-nnn (Option) (2 bytes)
 Represents the additional information pointer
(0 to 409) of each track. 00: music program without additional information.
= FNM-nnn (4 bytes)
 Represents the file number (0x0000 to 0xFFFF)
of an ATRK3 data file.
 The number nnnn (in ASCII) of the ATRAC3 data file name (A3Dnnnn) is converted into 0xnnnnn.
= APP_CTL (4 bytes) (Option)
 Represents an application parameter (T.B.D.)
(Normally, the value of the area APP_CTL is 0x0000).
= P-nnn (2 bytes)
 Represents the number of parts (1 to 2039)
that compose a music program. This area corresponds to the above-described area T-PART.
= PR (1 byte)
 Fixed value (PR = 0 x 50).

Next, the areas NAME1 (for one byte code) and NAME2 (for two byte code) for managing names will be described. FIG. 28 shows the detailed structure of the area NAME1 (for one byte code area). Each of the areas NAME1 and NAME2 (that will be described later) is segmented with eight bytes. Thus, their one slot is composed of eight bytes. At 0x8000 that is the beginning of each of these areas, a header is placed. The header is followed by a pointer and a name. The last slot of the area NAME1 contains the same areas as the header.

= BLKID-NM1 (4 bytes)
 Represents the contents of a block (fixed
value) (NM1 = 0x4E4D2D31).
= PNM1-nnn (4 bytes) (Option)
 Represents the pointer to the area NM1 (for
one byte code).
= PNM1-S
 Represents the pointer to a name representing
a memory card.
 nnn (= 1 to 408) represents the pointer to a music program title.
 The pointer represents the start position (2 bytes) of the block, the character code type (2 bits), and the data size (14 bits).
= NM1-nnn (Option)

Represents the memory card name and music program title for one byte code (variable length). An end code (0x00) is written at the end of the area.

FIG. 29 shows the detailed data structure of the area NAME2 (for two byte code). At 0x8000 that is the beginning of the area, a header is placed. The header is followed by a pointer and a name. The last slot of the area NAME2 contains the same areas as the header.

= BLKID-NM2 (4 bytes)
 Represents the contents of a block (fixed
value) (NM2 = 0x4E4D2D32).
= PNM2-nnn (4 bytes) (Option)
 Represents the pointer to the area NM2 (for
two byte code).
 PNM2-S represents the pointer to the name representing the memory card. nnn (= 1 to 408) represents the pointer to a music program title.
 The pointer represents the start position (2 bytes) of the block, the character code type (2 bits), and the data size (14 bits).
= NM2-nnn (Option)

Represents the memory card name and music program title for two byte code (variable). An end code (0x0000) is written at the end of the area.

FIG. 30 shows the data arrangement (for one block) of the ATRAC3 data file A3Dnnnn in the case that 1 SU is composed of N bytes. In this file, one slot is composed of eight bytes. FIG. 30 shows the values of the top portion (0x0000 to 0x3FF8) of each slot. The first four slots of the file are used for a header. As with the data block preceded by the attribute header of the data file (see FIG. 17) of the first example, a header is placed. The header contains an area BLKID-A3D (4 bytes), a maker code area MCode (2 bytes), an area BLOCK SEED (8 bytes) necessary for encrypting process, an area CONNUM0 (4 bytes) for the initial contents cumulation number, a serial number area BLOCK SERIAL (4 bytes) for each track, and an area INITIALIZATION VECTOR (8 bytes) necessary for encrypting/decrypting process. The second last slot of the block redundantly contains an area BLOCK SEED. The last slot contains areas BLKID-A3D and MCode. As with the first embodiment, the header is followed by the sound unit data SU-nnnn.

Figures 31, 32:
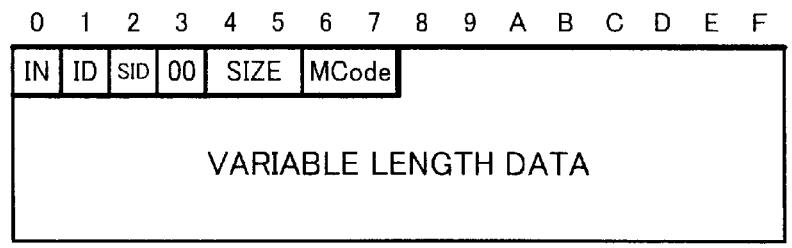
FIG. 31 is a schematic diagram showing the detailed data structure of INFLIST.MSF that represents additional information.
FIG. 32 is a schematic diagram showing the detailed data structure of INFLIST.MSF that represents additional information data.

FIG. 31 shows the detailed data structure of the additional information management file INFLIST that contains additional information. In the second embodiment, at the beginning (0x0000) of the file INFLIST, the following header is placed. The header is followed by the following pointer and areas.

= BLKID-INF (4 bytes)
 Represents the contents of the block (fixed
value) (INF = 0x494E464F).
= T-DAT (2 blocks)
 Represents the number of total data areas (0
to 409).
= MCode (2 bytes)
 Represents the maker code of the
recorder/player
= YMDhms (4 bytes)
 Represents the record updated date and time.
= INF-nnnn (4 bytes)
 Represents the pointer to the area DATA of
the additional information (variable length, as 2 bytes (slot) at a time). The start position is represented with the high order 16 bits (0000 to FFFF).
= DataSlot-0000 (0x0800)
 Represents the offset value from the
beginning (as a slot at a time).

The data size is represented with low order 16 bits (0001 to 7FFF). A disable flag is set at the most significant bit. MSB=0 (Enable), MSB=1 (Disable)

The data size represents the total data amount of the music program.

(The data starts from the beginning of each slot. (The non-data area of the slot is filled with 00.)

The first INF represents a pointer to additional information of the entire album (normally, INF-409).

FIG. 32 shows the structure of additional information. An 8-byte header is placed at the beginning of one additional information data area. The structure of the additional information is the same as that of the first embodiment (see FIG. 12C). In other words, the additional information contains an area IN (2 bytes) as an ID, an area key code ID (1 byte), an area SIZE (2 bytes) that represents the size of each additional information area, and a maker code area MCode (2 bytes). In addition, the additional information contains an area SID (1 byte) as a sub ID.

Figure 33:
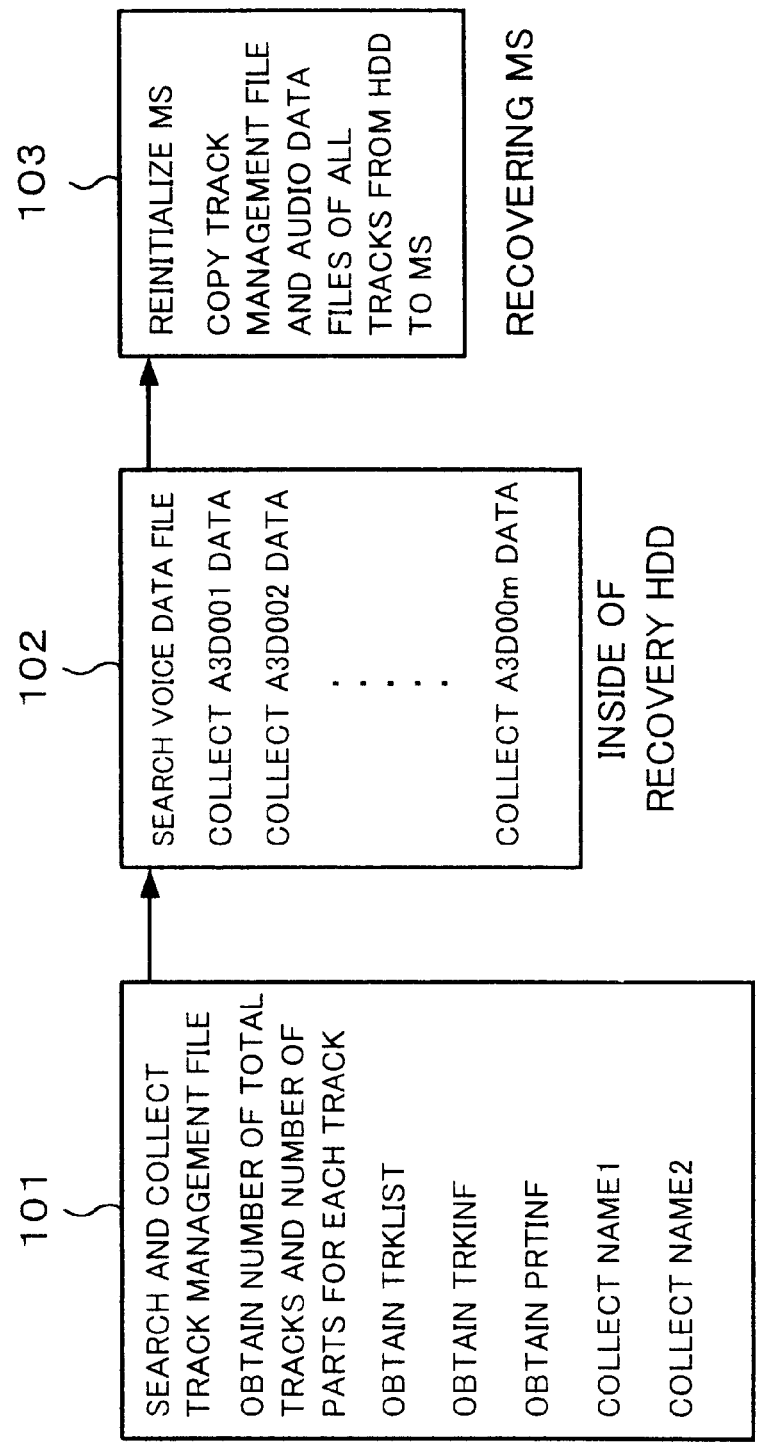
FIG. 33 is a flow chart showing a recovering method according to the second embodiment of the present invention in the case that an FAT area was destroyed.

According to the second embodiment of the present invention, in addition to the file system defined as a format of the memory card, the track information management file TRKLIST or music data is used. Thus, even if the FAT is destroyed, the file can be recovered. FIG. 33 shows a flow of a file recovering process. To recover the file, a computer that operates with a file recovery program and that can access the memory card and a storing device (hard disk, RAM, or the like) connected to the computer are used. The computer has a function equivalent to the DSP30. Next, a file recovering process using the track management file TRKLIST will be described.

All blocks of the flash memory whose FAT has been destroyed are searched for TL-0 as the value (BLKID) at the top position of each block. In addition, all the blocks are searched for NM-1 as the value (BLKID) at the top position of each block. Thereafter, all the blocks are searched for NM-2 as the value (BLKID) at the top position of each block. All the contents of the four blocks (track information management file) are stored to for example a hard disk by the recovery computer.

The number of total tracks is obtained from data after the fourth byte of the track information management file. The 20-th byte of the track information area TRKINF-001, the value of the area CONNUM-001 of the first music program, and the value of the next area P-001 are obtained. The number of parts is obtained with the value of the area P-001. The values of the areas PRTSIZE of all parts of the track 1 of the area PRTINF is obtained. The number of total blocks (clusters) n is calculated and obtained.

After the track information management file is obtained, the flow advances to step 102. At step 102, a voice data file (ATRAC3 data file) is searched. All blocks of other than the management file is searched from the flash memory. Blocks whose top value (BLKID) is A3D are collected.

A block of which the value of the area CONNUM0 at the 16-th byte of A3Dnnnn is the same as that of the area CONNUM-001 of the first music program of the track information management file and of which the value of the area BLOCK SERIAL that starts from 20-th byte is 0 is searched. After the first block is obtained, a block (cluster) with the same value of the area CONNUM value as the first block and of which the value of BLOCK SERIAL is incremented by 1 (1=0+1) is searched. After the second block is obtained, a block with the same value of the area CONNUM0 as the second block and of which the value of the area BLOCK SERIAL is incremented by 1 (2=1+1) is searched.

By repeating the process, the ATRC3 data file is searched until n blocks (clusters) of the track 1 are obtained. When all the blocks (clusters) are obtained, they are successively stored to the hard disk.

The same process for the track 1 is performed for the track 2. In other words, a block of which the value of the area CONNUM0 is the same as that of the area CONNUM-002 of the first music program of the track information management file and of which the value of the area BLOCK SERIAL that starts at the 20-th byte is searched. Thereafter, in the same manner as the track 1, the ATRAC3 data file is searched until the last block (cluster) n' is detected. After all blocks (clusters) are obtained, they are successively stored to the hard disk.

By repeating the above-described process for all tracks (the number of tracks: m), all the ATRAC3 data is stored to the hard disk controlled by the recovering computer.

At step 103, the memory card whose the FAT has been destroyed is re-initialized and then the FAT is reconstructed. A predetermined directory is formed in the memory card. Thereafter, the track information management file and the ATRAC3 data file for m tracks are copied from the hard disk to the memory card. Thus, the recovery process is finished.

In the management file and data file, important parameters (in particular, codes in headers) may be recorded triply rather than doubly. When data is redundantly recorded, the same data may be recorded at any positions as long as they are apart from each other for one page or more.

According to the present invention, when a data file (ATRAC3 file) reproduced from a memory card has reproduction limitation information with respect to the number of reproduction times, a reproducing operation is defined. When the number of reproduction times exceeds a predetermined value, the reproducing operation is prohibited. Next, a portion with respect to the reproduction limitation will be described corresponding to the track management file TRKLIST explained with reference to FIGS. 25 to 32. However, likewise, such a portion can be applied corresponding to the reproduction limitation information contained in the track information TRKINF of the attribute header of an ATRAC3 data file shown in FIG. 9.

Figure 34:
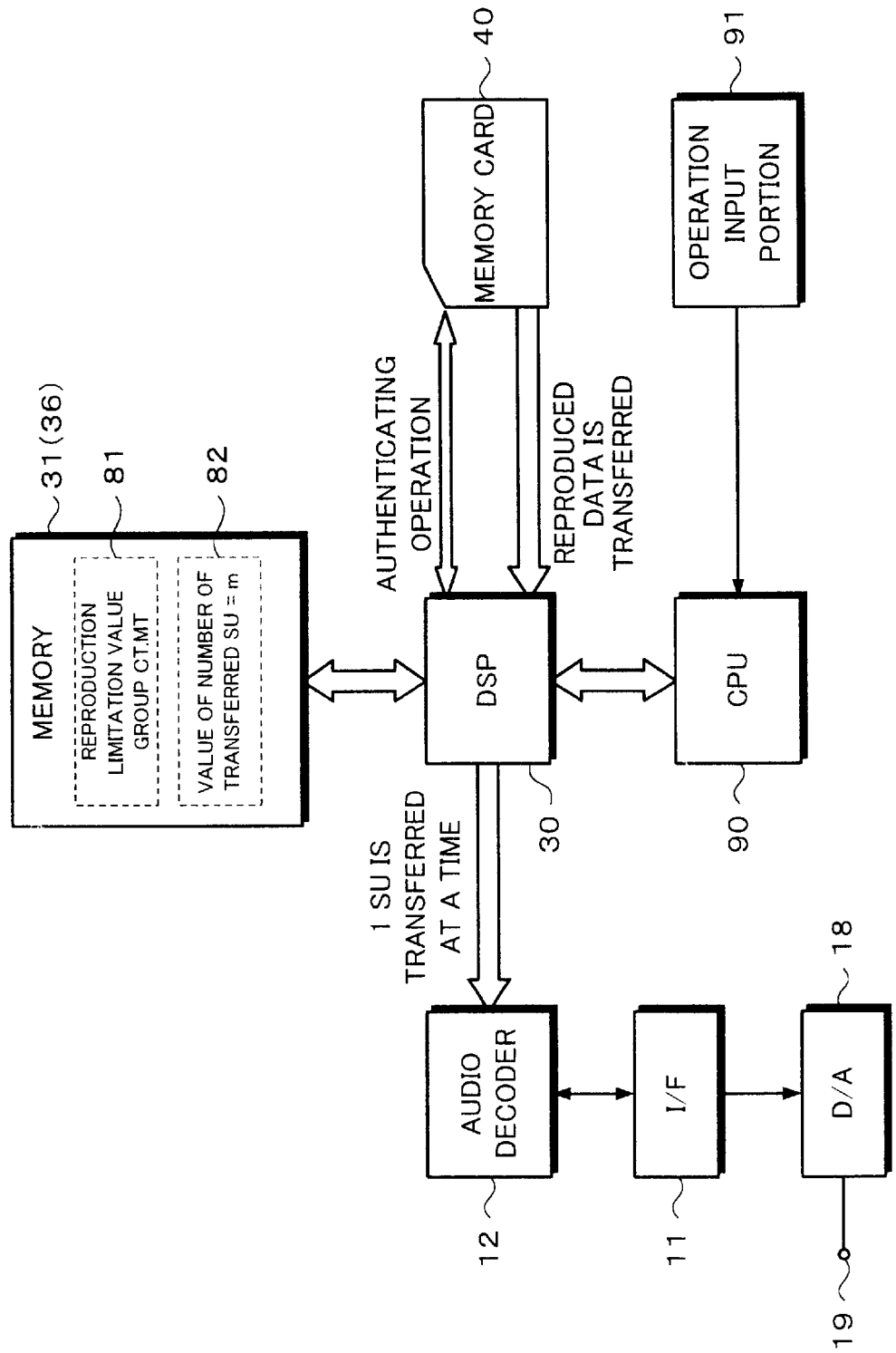
FIG. 34 is a block diagram showing the structure of the reproducing apparatus according to the present invention.

FIG. 34 is a block diagram showing the structure of a feature portion of the present invention in the above-described digital audio recorder. The portion according to the present invention comprises a DSP 30, a memory card 40, a CPU 90, an operation input portion 91, an SRAM 31 (or 36), an audio decoder 12, an interface 11, and a D/A converting circuit 18. The CPU 90 and the operation input portion 91 are disposed in an amplifier or the like that is connected to the outside of the digital audio recorder through the above-described bus 32. The CPU 90 and the operation input portion 91 allow various commands to be input and all the operations to be controlled. The operation that follows is accomplished as a software process of the DSP 30 or the CPU 90.

The operation input portion 91 has a normal reproduction button, a stop button, a fast forward button, a pause button, a rewind button, an automatic music program selection button, and so forth. The automatic music program selecting operation is one of file searching operations. With the automatic music program selecting operation, a music program (track) recorded in the memory card 40 is automatically selected. The operation input portion 91 generates an operation signal corresponding to the state of each switch/button. The operation signal is supplied to the CPU 90. With a control signal corresponding to the operation signal received from the operation input portion 91, the reproducing operation and so forth are performed.

When the memory card 40 is attached to the player or the reproduction button is pressed, the memory card is authenticated (namely, it is determined whether or not the attached memory card is valid). After the authenticating process has been successfully performed, the DSP 30 reads the track information management file TRKLIST.MSF from the flash memory of the memory card 40 to the SRAM 31 or 36. In addition, the DSP 30 reads a reproduction limitation value group from the track information management file TRKLIST.MSF to the SRAM 31 or 36.

The DSP 30 transfers an audio file that is read from the memory card 40 to the audio decoder 12 for 1 SU at a time. The audio decoder 12 decodes the audio file. In this case, an encrypted audio file is encrypted. In FIG. 34, for simplicity, the encrypting portion is omitted. A decoded output signal is supplied to the D/A converting circuit 18 through the interface circuit 11. The D/A converting circuit 18 generates a reproduced audio signal. The reproduced audio signal is obtained through an output terminal 19. The reproduced audio signal is supplied to an amplifier (not shown) or the like and reproduced as an audio sound therefrom.

The DSP 30 controls the permission/prohibition of the reproducing operation corresponding to the reproduction start date, the reproduction expiration date, the number of track reproduction times CT, the forged information detection flag, and so forth. When forged reproduction limitation information is detected, the DSP 30 prohibits the reproducing operation. When the number of reproduction times is smaller than the permitted value and the forged information is not detected, the DSP 30 permits the reproducing operation.

On the other hand, when the DSP 30 has detected forged information, the DSP 30 generates control information and prohibits the reproducing operation. Even if the DSP 30 has not detected forged information, when the number of reproduction times exceeds the reproduction limitation value, the DSP 30 prohibits the reproducing operation. To determine whether the number of reproduction times exceeds the reproduction limitation value, it is necessary for the DSP 30 to define a reproducing operation.

To do that, the DSP 30 converts the value of SU of the reproduced data transferred to the audio decoder 12 into reproduction duration and assumes that when the cumulation duration of the reproduction duration of the same track (same music program file) becomes a predetermined value, the track has been reproduced one time. For example, since 51 SU is equivalent to one second in a particular mode, in the case that when a track is reproduced for 30 seconds, the track is reproduced one time, when reproduced data of 51×30=1530 SU is transferred to the audio decoder 12, it is assumed that the reproducing operation is performed one time.

When a track is reproduced one time, the number of reproduction times CT stored in the SRAM 31 or 36 is decremented by 1 (namely, CT=CT−1). When the reproduction command is supplied to the DSP 30 through the CPU 90, the DSP 30 re-calculates a hash value corresponding to the number of reproduction times CT and determines whether or not the current hash value matches the previous hash value. When they match, the DSP 30 determines that the number of reproduction times CT as the reproduction limitation information has not been forged. When they do not match, the DSP 30 determines that the number of reproduction times CT has been likely forged. When the number of reproduction times CT has not been forged, the reproducing operation is performed and the number of reproduction times CT is decremented by 1. When the memory card 40 is detached from the player and then attached thereto or when the power of the player is turned off, before a track is reproduced, the hash value is calculated. The obtained hash value is stored in a particular area of the nonvolatile memory of the encrypting circuit 22 in such a manner that the hash value is not accessed from the outside. In other words, the DSP 30 only receives the compared result, not reads the hash value itself. According to the present invention, a process for determining whether or not the reproduction limitation information has been forged is not always required.

When the user performs the fast forward operation, the rewind operation, or the pause operation with the operation input portion 91 while a track is being reproduced, the counting of the reproduction duration of the track to be reproduced is temporarily stopped. When the user performs the stop operation or the automatic music program selecting operation while a track is being reproduced, the counting of the reproduction duration of the track to be reproduced is reset.

Figure 35:
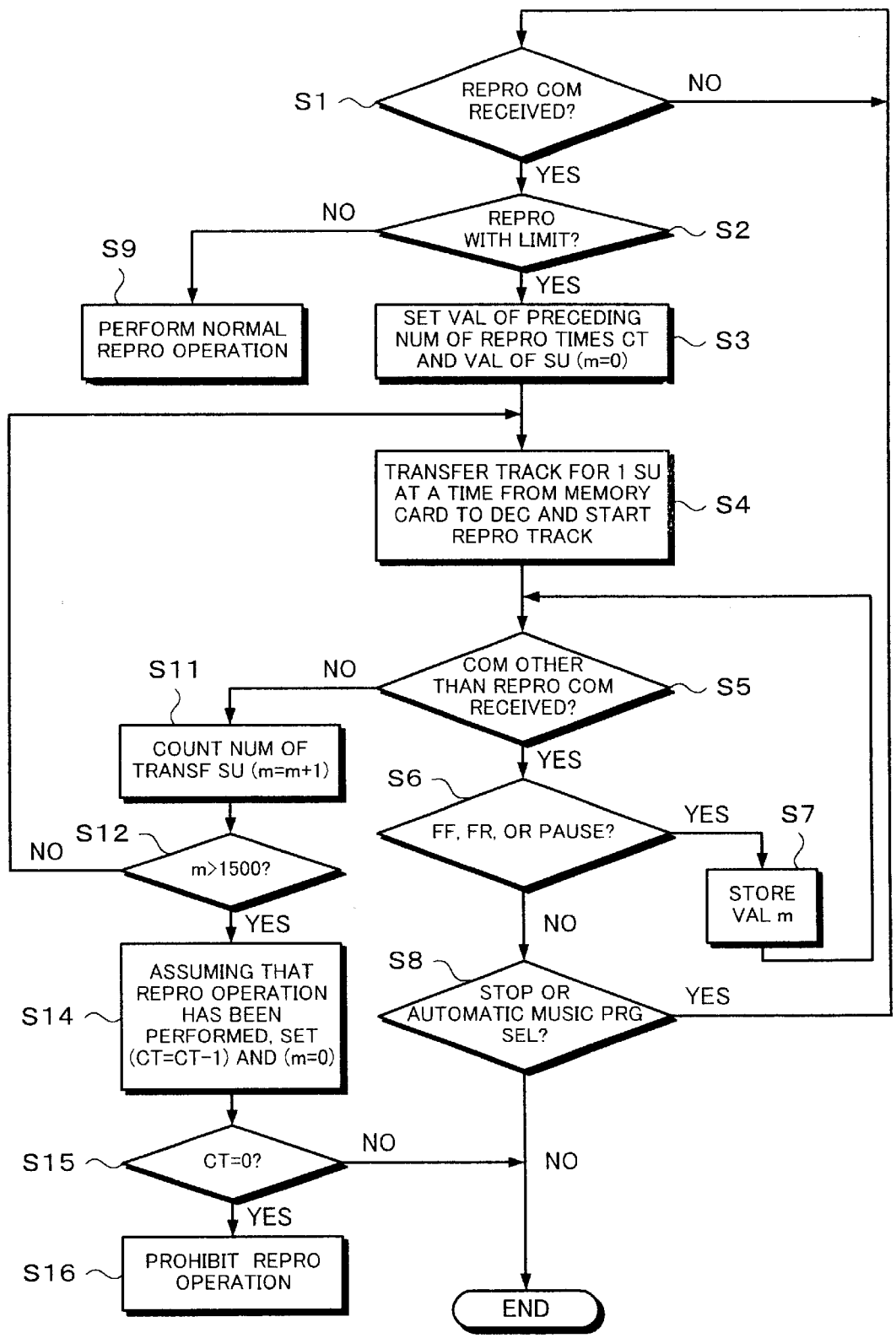
FIG. 35 is a flow chart showing a reproduction limitation information updating process according to the present invention.

Next, the reproducing operation according to the embodiment will be described in detail. FIG. 35 is a flow chart showing a process for treating a partial reproducing operation for around 30 seconds as a reproducing operation.

At step S1, it is cyclically determined whether or not the reproduction command has been received. When the determined result at step S1 is Yes, the flow advances to step S2. At step S2, it is determined whether or not the-current track (music program) having reproduction limitation information is reproduced with reference to the track information management file TRKLIST stored in the SRAM 31 or 36 (at step S2). When the determined result at step S2 is No, the flow advances to step S9. At step S9, the track file is normally reproduced.

When the determined result at step S2 is Yes, the flow advances to step S3. At step S3, the preceding value of the number of reproduction times CT is set. In addition, the value m of SU (Sound Unit) transferred from the DSP 30 to the audio decoder 12 is set to 0 (namely, m=0). The preceding value of the number of reproduction times CT is recorded in the track information management file TRKLIST of the SRAM 31 or 36. The value m of SU is recorded in a predetermined area of the SRAM 31 or 36. The forged information is checked with a hash value at steps S2 and S3.

Thereafter, the flow advances to step S4. At step S4, the current audio file is read from the memory card 40. The audio file is transferred for 1 SU at a time to the audio decoder 12 through the DSP 30. The audio file is decoded by the audio decoder 12. The decoded output data is supplied to the D/A converting circuit 18 through the interface circuit 11. A reproduced audio signal that is output from the D/A converting circuit 18 is obtained through the output terminal 19. The obtained audio signal is supplied to an amplifier (not shown) and reproduced as an audio sound.

In parallel with the reproducing process, the CPU 90 monitors the operation state of the operation input portion 91. At step S5, it is determined whether or not a button other than the reproduction button has been pressed. When the determined result at step S5 is No, the flow advances to step S11. At step S11, the value m of the number of transferred SU is counted. In other words, the value m of the number of transferred SU is incremented by 1 (namely, m=m+1).

At step S12, it is determined whether or not the value m of the number of transferred SU exceeds 1500 (around 30 seconds). When the determined result at step S12 is No, the flow returns to step S4. At step S4, the next SU is transferred.

When a button other than the reproduction button is not pressed and the value m of the number of transferred SU does not exceed 1500, the number of transferred SU is incremented by 1.

When the determined result at step S12 is Yes, the flow advances to step S14. At step S14, assuming that the file has been reproduced one time, the number of reproduction times CT is decremented by 1 (namely, CT=CT−1) and the value m of the number of transferred SU (Sound Unit) is reset to 0 (namely, m=0). The decremented value (CT−1) is rewritten to the track information management file of the memory card 40.

Thereafter, the flow advances to step S15. At step S15, it is determined whether or not the number of reproduction times CT that has been decremented is 0. When the determined result at step S15 is Yes (namely, CT=0), the flow advances to step S16. At step S16, a process for prohibiting the reproducing operation is performed. In other words, the DSP 30 generates control information that prohibits the reproducing operation and supplies the control information to each portion of the player. In this case, the user is informed of an audio and/or visual message that represents that the reproducing operation is prohibited because the number of reproduction times CT exceeds the set value. When the determined result at step S15 is No (namely, CT ≠0), the process for the number of reproduction times is completed. Thus, the reproducing operation is continued.

When the determined result at step S5 is Yes, the flow advances to step S6. At step S6, it is determined whether the first forward button, the rewind button, or the pause button has been pressed for the fast forward reproducing operation, the rewind operation, or the pause button. When the determined result at step S6 is Yes, the flow advances to step S7. At step S7, the value m of the number of transferred SU is stored. Thereafter, the flow returns to step S5.

When the determined result at step S6 is No, the flow advances to step S8. At step S8, it is determined whether the stop operation or the automatic music program selecting operation has been performed. When the automatic music program selecting operation is performed, the current track that is being reproduced is stopped and the next track is reproduced. Thus, when the automatic music program selecting operation has been selected, a reproduction request is transmitted from the CPU 90 to the DSP 30. Thus, the flow returns to step S1. At step S1, it is determined that the reproduction command for the automatic music program selecting operation has been received. When the determined result at step S8 is No, the process for the number of reproduction times is completed.

In the above-described example, whenever the reproducing operation is performed, the number of reproduction times CT is decremented by 1. When the value of the number of reproduction times CT becomes 0 (namely, CT=0), the reproducing operation is prohibited. Alternatively, the number of reproduction times CT may be incremented by 1 whenever the reproducing operation is performed. When the number of reproduction times CT becomes equal to the number of reproduction permission times MT (namely, MT=CT), the reproducing operation may be prohibited. As another alternative method, the number of reproduction permission times MT may be decremented by 1 whenever the reproducing operation is performed. In this case, the number of reproduction times CT is not used. The values of the number of reproduction times CT and the number of reproduction permission times MT are changed in the above-mentioned processes. When the memory card 40 is detached from the player or the power of the player is turned off, these values are rewritten to the track information management file TRKLIST of the memory card 40.

In the above-described embodiment, when the value m of the number of transferred SU exceeds 1500 (around 30 seconds), it is assumed that the current file has been reproduced one time. However, it should be noted that the value m is not limited to 1500. In addition, the reproduction duration may be calculated with another time unit.

In the above description, the present invention was applied to a digital audio recorder. However, the present invention can be also applied to other video/audio apparatuses. In addition, it is clear that the present invention can be applied to a medium using a flash memory regardless of its storage capacity and its shape.

According to the present invention, when the cumulation duration of the normal reproduction duration of contents having the number of reproduction limitation times exceeds a predetermined value, it is defined that the contents have been reproduced one time. The defined number of reproduction times is compared with the number of reproduction limitation times. The reproducing operation can be performed for the number of reproduction limitation times. Thus, contents with reproduction limitation information can be reproduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A reproducing apparatus, comprising:

memory means for recording a plurality of files and number-of-reproduction-times limitation information thereof;

operation means for selecting a desired file from the plurality of files stored in said memory means so as to reproduce the selected file;

determining means for determining whether or not the number-of reproduction-times limitation information has been set to the file selected by said operating means;

first comparing means for comparing whether the number-of-reproduction-times limitation information allows for reproduction of the selected file;

counting means for counting the reproduced elapsed duration of the file selected by said operating means when the number-of-reproduction-times limitation information has been set to the selected file as the determined result of said determining means, and after reproduction has begun as the result of the first comparing means;

second comparing means for comparing the reproduced elapsed duration counted by said counting means exceeds a predetermined value; and editing moans for editing the number-of reproduction-times limitation information stored in said memory means when the reproduced elapsed duration counted by said counting means exceeds the predetermined value as the determined result of said comparing means to reduce the number of times the selected file may subsequently be reproduced.

2. The reproducing apparatus as set forth in claim 1, wherein said memory means is composed of a nonvolatile memory.

3. The reproducing apparatus as set forth in claim 1, wherein said memory means is detachable from a housing of the reproducing apparatus.

4. The reproducing apparatus as set forth in claim 1, wherein the count value of said counting means is reset when a reproduction stop command for the selected file is issued in the condition that the reproduced elapsed duration counted by said counting means does not exceed the predetermined value.

5. The reproducing apparatus as set forth in claim 4, wherein the reproduction stop command for the selected file is a reproduction stop command.

6. The reproducing apparatus as set forth in claim 4, wherein the reproduction stop command for the selected file is a file search command.

7. The reproducing apparatus as set forth in claim 4, wherein the reproduction stop command for the selected file is a reproduction pause command.

8. The reproducing apparatus as set forth in claim 4, wherein the reproduction stop command for the selected file is a high speed reproduction command.

9. The reproducing apparatus as set forth in claim 1, wherein said editing process decrements the value of the number-of-reproduction-times limitation information by 1.

10. The reproducing apparatus as set forth in claim 1, wherein the selected file is prohibited from being reproduced when the number-of-reproduction-times limitation information becomes a limit value.

11. A method for reproducing a selected file from a record medium, comprising the steps of:

(a) causing the selected file recorded in the record medium to be reproduced;

(b) determining whether or not number-of-reproduction-times limitation information has been set to the selected file;

(c) comparing whether the number-of-reproduction-times limitation information allows for reproduction of the selected file;

(d) counting the reproduced elapsed duration of the selected file when the number-of-reproduction-times limitation information has been set to the selected file as the determined result at step (b), and after reproduction has begun as a result of the comparison result at step (c);

(e) comparing the counted reproduced elapsed duration exceeds a predetermined value; and (f) editing the number-of-reproduction-times limitation information stored in the record medium when the reproduced elapsed duration counted at step (d) exceeds the predetermined value as the determined result at step (c) so as to reduce the number of times the selected file may subsequently be reproduced.

12. The method as set forth in claim 11, wherein the record medium is composed of a nonvolatile memory.

13. The method as set forth in claim 11, wherein the record medium is detachable from a housing.

14. The method as set forth in claim 11, wherein the count value is reset wherein a reproduction stop command for the selected file is issued in the condition that the reproduced elapsed duration counted by said counting means does not exceed the predetermined value.

15. The method as set forth in claim 14, wherein the reproduction stop command for the selected file is a reproduction stop command.

16. The method as set forth in claim 14, wherein the reproduction stop command for the selected file is a file search command.

17. The method as set forth in claim 14, wherein the reproduction stop command for the selected file is a reproduction pause command.

18. The method as set forth in claim 14, wherein the reproduction stop command for the selected file is a high speed reproduction command.

19. The method as set forth in claim 11, wherein step (e) is performed by decrementing the value of the number-of-reproduction-times limitation information by 1.

20. The method as set forth in claim 11, wherein the selected file is prohibited from being reproduced when the number-of-reproduction-times limitation information becomes a limit value.

* * * * *